| US011150551B2

United States Patent
Oh et al.

(10) Patent No.: US 11,150,551 B2
(45) Date of Patent: Oct. 19, 2021

(54) METHOD FOR OPTICAL PROXIMITY CORRECTION IN WHICH CONSISTENCY IS MAINTAINED AND METHOD FOR MANUFACTURING MASK USING THE SAME

(71) Applicant: Samsung Electronics Co., Ltd., Suwon-si (KR)

(72) Inventors: Heungsuk Oh, Bucheon-si (KR); Joobyoung Kim, San Jose, CA (US); Sanghun Kim, Seoul (KR); Guk Hyun Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/855,083

(22) Filed: Apr. 22, 2020

(65) Prior Publication Data

US 2021/0109437 A1    Apr. 15, 2021

Related U.S. Application Data

(60) Provisional application No. 62/915,109, filed on Oct. 15, 2019.

(30) Foreign Application Priority Data

Nov. 6, 2019    (KR) ........................ 10-2019-0141095

(51) Int. Cl.
*G06F 30/392*     (2020.01)
*G03F 1/36*       (2012.01)

(52) U.S. Cl.
CPC .............. *G03F 1/36* (2013.01); *G06F 30/392* (2020.01)

(58) Field of Classification Search
USPC ........................................... 716/53
See application file for complete search history.

(56) References Cited

U.S. PATENT DOCUMENTS

| | | | |
|---|---|---|---|
| 6,243,855 B1 | 6/2001 | Kobayashi et al. |
| 6,516,459 B1 | 2/2003 | Sahouria |
| 6,687,895 B2 | 2/2004 | Zhang |
| 6,854,104 B2 | 2/2005 | Aleshin et al. |
| 6,952,818 B2 | 10/2005 | Ikeuchi |
| 7,000,208 B2 | 2/2006 | Zhang |

(Continued)

FOREIGN PATENT DOCUMENTS

JP    4510118 B2    7/2010

*Primary Examiner* — Bryce M Aisaka
(74) *Attorney, Agent, or Firm* — Harness, Dickey & Pierce, P.L.C.

(57) ABSTRACT

A computer-readable medium includes a program code that, when executed by a processing circuitry, causes the processing circuitry to divide a layout of a semiconductor chip into a plurality of patches, generate a plurality of segments from a layout of each of the plurality of patches, wherein a first patch of the plurality of patches includes first segments and a second patch of the plurality of patches includes second segments, calculate hash values respectively corresponding to the first segments and the second segments by using a hash function, calculate bias values of segments having a first hash value from among the first segments, calculate a representative value based on the bias values, and apply the representative value to the segments having the first hash value from among the first segments.

20 Claims, 15 Drawing Sheets

(56) References Cited

U.S. PATENT DOCUMENTS

| | | |
|---|---|---|
| 7,418,693 B1 | 8/2008 | Gennari et al. |
| 7,458,056 B2 | 11/2008 | Pierrat |
| 7,818,707 B1 | 10/2010 | Gennari et al. |
| 7,900,170 B2 | 3/2011 | Suh et al. |
| 7,979,811 B2 | 7/2011 | Wu et al. |
| 9,952,499 B2 | 4/2018 | Jeong et al. |
| 9,996,658 B2 | 6/2018 | Kim et al. |
| 10,726,178 B1 * | 7/2020 | L'Esperance ....... G06F 30/3323 |

* cited by examiner

METHOD FOR OPTICAL PROXIMITY CORRECTION IN WHICH CONSISTENCY IS MAINTAINED AND METHOD FOR MANUFACTURING MASK USING THE SAME

CROSS-REFERENCE TO RELATED APPLICATIONS

This application claims priority under 35 U.S.C. § 119 to U.S. Patent Provisional No. 62/915,109 filed Oct. 15, 2019 and Korean Patent Application No. 10-2019-0141095 filed on Nov. 6, 2019, in the Korean Intellectual Property Office, the disclosures of each of which are incorporated by reference herein in their entireties.

BACKGROUND

Example embodiments of inventive concepts described herein relate to a semiconductor process, and more particularly, relate to a method of optical proximity correction in which consistency is maintained and/or a method for manufacturing a mask by using the same.

With the rapid development of electronic industries, there is an increasing demand on an electronic device having a higher performance, a higher reliability, and/or a smaller size. The electronic device is implemented with semiconductor devices manufactured, e.g. fabricated, by a semiconductor manufacturing process. Accordingly, to satisfy the demands/requirements, a structure of a semiconductor device may gradually become complicated, and/or may be highly integrated.

At least one photolithography process may be used in the fabrication of the semiconductor devices. A layout, e.g. a layout of one of the layers including various patterns, is printed on a semiconductor substrate such as a semiconductor wafer through the photolithography process. However, as the degree of integration of the semiconductor process increases, a distance between image patterns of a mask becomes very close. Because of this "proximity", the interference and/or diffraction of light occur, and a distorted layout different from a target layout is printed on the substrate.

To prevent or reduce the amount the distortion of the layout, a resolution enhancement technology such as optical proximity correction (OPC) may be used, and the mask may include OPC features such as serifs to reduce the amount of distortion on the layout. However, in the case of performing the OPC on patterns having the same shape and the same surrounding condition, maintaining the consistency is very important in terms of the reliability of the semiconductor device. Alternatively or additionally, a simulation process for generating a bias value requires a lot of time. Therefore, it performing the optical proximity correction efficiently, with maintaining consistency, is very important.

SUMMARY

Some example embodiments of inventive concepts provide an optical proximity correction method that makes it possible to maintain the consistency with respect to patterns having the same ambient condition.

Alternatively or additionally, some example embodiments of inventive concepts provide a method for manufacturing a mask generated by using optical proximity correction that may make it possible to maintain the consistency.

According to some example embodiments, a non-transitory computer-readable medium includes a program code that, when executed by at least one processing circuitry, causes the at least one processing circuitry to divide a layout of a semiconductor chip into a plurality of patches, generate a plurality of segments from the divided layout of each of the plurality of patches, wherein a first patch of the plurality of patches includes first segments and a second patch of the plurality of patches includes second segments, calculate hash values corresponding to the first segments and hash values corresponding to the second segments, the calculating the hash values being by using a hash function, calculate bias values of a subset of first segments having a first hash value, calculate a representative value based on the bias values, and apply the representative value to the subset of segments having the first hash value from among the hash values of the first segments. The hash function depends on at least one of a first characteristic value of each segment of the plurality of segments, a second characteristic value of at least one segment adjacent to the each segment, or a third characteristic value between the each segment and the at least one segment.

According to some example embodiments, a computer-readable medium includes a non-transitory program code that, when executed by at least one processing circuitry, causes the at least one processing circuitry to generate a plurality of segments from a layout of a semiconductor device, calculate a hash value of each segment of the plurality of segments by using a hash function which depends on at least one of a first characteristic value of the each segment, a second characteristic value of at least one segment adjacent to the each segment, or a third characteristic value between the each segment and the at least one segment, calculate bias values with respect to the plurality of segments, respectively, calculate a representative value based on bias values of a subset of the plurality of segments having the same hash value from among the calculated hash values, and apply the representative value to the plurality of segments having the same hash value.

According to some example embodiments, a method for manufacturing a semiconductor device includes generating a plurality of segments from a layout of the semiconductor device, calculating a hash value of each segment of the plurality of segments by using a hash function which depends on a first characteristic value of the each segment, a second characteristic value of at least one segment adjacent to the each segment, and a third characteristic value between the each segment and the at least one segment, calculating bias values with respect to the plurality of segments, respectively, calculating a representative value based on bias values of a plurality of segments having the same hash value from among the calculated hash values, generating a biased mask depending on the representative value, and forming patterns on a substrate by using the biased mask.

BRIEF DESCRIPTION OF THE FIGURES

The above and other objects and features of inventive concepts will become apparent by describing in detail example embodiments thereof with reference to the accompanying drawings.

DETAILED DESCRIPTION OF EXAMPLE EMBODIMENTS

Below, embodiments of inventive concepts may be described in detail and clearly to such an extent that an ordinary one in the art easily implements inventive concepts.

Components that are described in the detailed description with reference to the terms "unit", "module", "block", device, "~er or ~or", etc. and function blocks illustrated in drawings, for example, as described below, each of a master device 110 and the at least one slave devices 121 to 12n, along with the mask producing device 2000, may be implemented with processing circuitry, including software, hardware, or a combination thereof. For example, the software may be or may include a machine code, firmware, an embedded code, and/or application software. For example, the hardware may be or may include an electrical circuit, an electronic circuit, a processor, a computer, an integrated circuit, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), integrated circuit cores, a pressure sensor, an inertial sensor, a microelectromechanical system (MEMS), a passive element, or a combination thereof.

Figure 1:
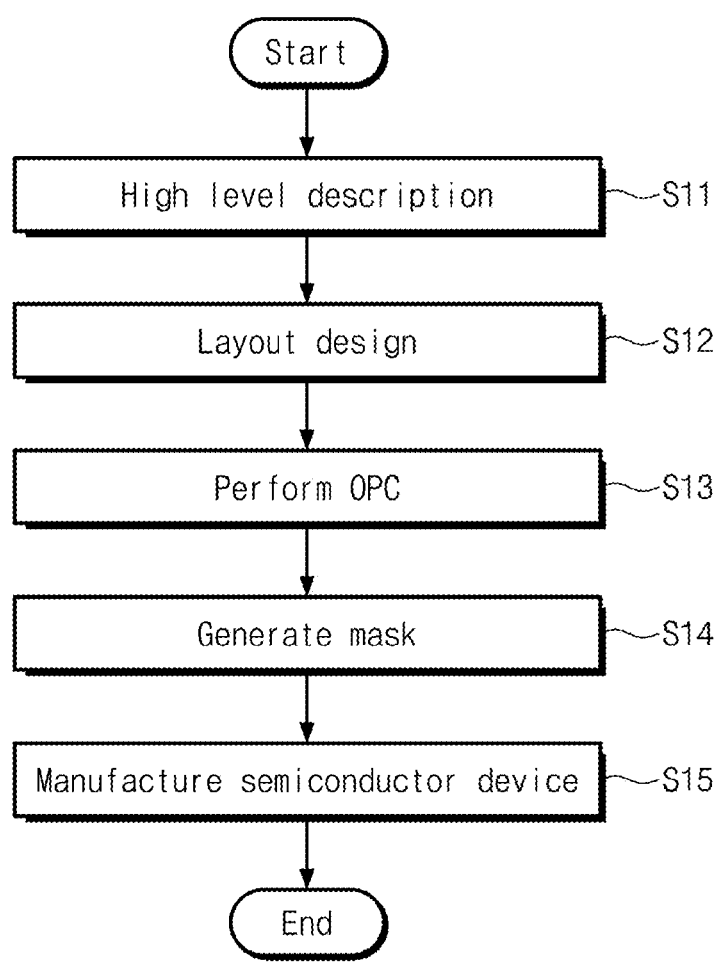
FIG. 1 is a flowchart illustrating a method for designing and manufacturing a semiconductor device according to some example embodiments of inventive concepts.

FIG. 1 is a flowchart illustrating a method for designing and manufacturing/fabricating a semiconductor device according to some example embodiments of inventive concepts.

Referring to FIG. 1, in operation S11, a high level design of a semiconductor integrated circuit may be performed. The high level design may mean and/or correspond to a description of a design-targeted integrated circuit with a high-level computer language. For example, the high-level language such as C language may be used. Alternatively or additionally, other hardware description languages may be used in the high-level language, such as VHDL and/or Verilog; however, example embodiments are not limited thereto. Circuits designed by the high level design may be expressed in more detail by register transfer level (RTL) coding and/or simulation. In addition, a code generated by the RTL coding may be converted into a netlist so as to be synthesized to portions of, or the whole of, the semiconductor device. The synthesized schematic circuit may be verified by a simulation tool, and an adjustment process may be accompanied depending on a verification result.

In operation S12, a layout, e.g. a layout for an individual level (layer) or for a plurality of levels (layers) for implementing a semiconductor integrated circuit on a silicon substrate may be designed. For example, the layout design may be performed with reference to the schematic circuit synthesized in the high level design and/or the netlist corresponding to the schematic circuit. The layout design may include procedures for placing various standard cells provided from a cell library, along with a routing procedure connecting the placed cells. The layout design may be repeated for each level/layer associated with the manufacturing/fabrication of the semiconductor integrated circuit.

The cell library for the layout design may include information about an operation, a speed, and/or power consumption of a standard cell. A cell library for expressing a circuit of a particular gate level with a layout may be defined in most layout design tools. The layout may be a procedure of defining the size and/or shape of a pattern associated with electrical components such as transistors, polysilicon and/or metal wires, and/or interconnections such as contacts and vias, that will be actually formed on a silicon substrate. Additional components such as interlayer insulating material may be associated with the layout of a layer. For example, to fabricate an inverter circuit on a silicon substrate, layout patterns such as a PMOS transistor, an NMOS transistor, an N-WELL, a gate electrode, and/or metal wires disposed thereon may be properly placed. To this end, first, one of inverters defined a-priori in a cell library may be found and selected.

In addition, the routing may be performed on the selected and placed standard cells. For example, the routing with upper wires may be performed on the selected and placed standard cells. The routing procedure may interconnect standard cells as appropriate for the design. Most of a series of processes described above may be automatically performed by the layout design tool, or may be at least partially manually performed. For example, the place and routing of the standard cells may be automatically performed by using a separate place and routing (P&R) tool. The P&R tool may be implemented in hardware and/or software.

After the routing, the design may be verified to determine whether there is a portion violating the design rule. The verification may include a design rule check (DRC) for verifying whether components of the layout are arranged and/or sized appropriately for a given design rule, an electrical rule check (ERC) for verifying whether the components of the layout are connected without internal electrical disconnection, layout vs schematic (LVS) for determining whether the layout coincides with a gate-level netlist, etc. Each of, or at least some of, the DRC, ERC, and LVS tools may be implemented in hardware.

In operation S13, optical proximity correction (OPC) may be performed. Layout patterns obtained through the layout design may be implemented on a silicon substrate by using a photolithography process. In this case, the OPC may refer to a technology for correcting or reducing the distortion due to the photolithography process. For example, the distortion, such as refraction due to a characteristic of light in an exposure process using the designed layout pattern, or a process effect may be corrected or improved through the optical proximity correction. Shapes and/or locations of the designed layout patterns may be finely corrected (or biased) while performing the optical proximity correction. The optical proximity correction of inventive concepts will be described in detail later.

In operation S14, a photomask may be manufactured based on the layout changed by the optical proximity correction. In general, the photomask may be manufactured in a way to depict the layout patterns by using a chrome thin layer applied on a glass substrate. In general, a photomask may correspond to one level (one layer) associated in the manufacturing of a semiconductor device; however, example embodiments are not limited thereto.

In operation S15, a semiconductor device may be manufactured (e.g. fabricated) by using the photomask. In the process of manufacturing the semiconductor device by using the photomask, various manners of processes, such as exposure and etching processes and/or exposure and implantation processes, may be repeated. Through such processes, a shape of patterns determined upon designing the layout may be sequentially formed on the silicon substrate.

Figure 2:
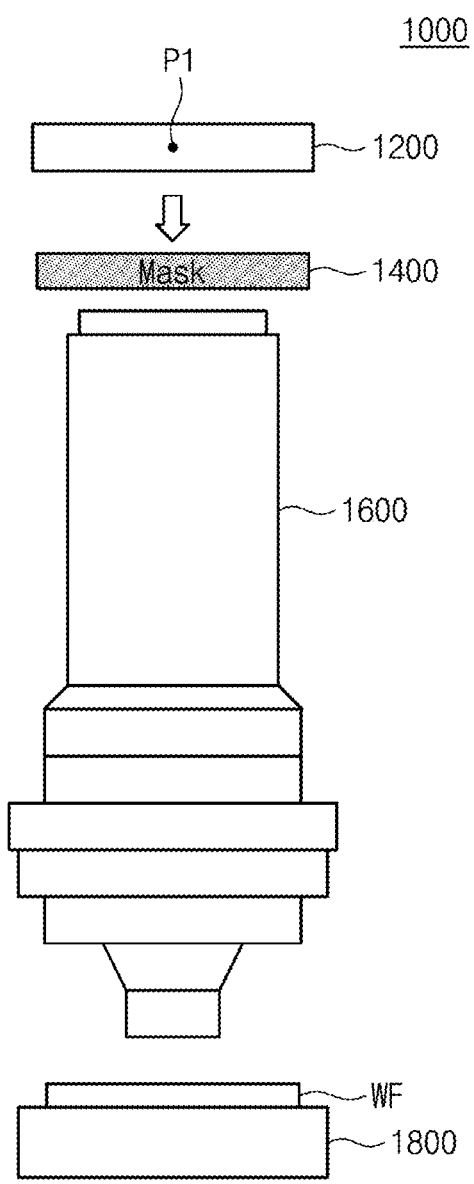
FIG. 2 conceptually illustrates a photolithography system used to manufacture a mask according to some example embodiments of inventive concepts.

FIG. 2 conceptually illustrates a photolithography system used to manufacture a mask according to some example embodiments of inventive concepts. Referring to FIG. 2, a photolithography system 1000 may include a light source 1200, a mask 1400, a reduction projection device 1600, and a wafer stage 1800. However, the photolithography system 1000 may further include components that are not illustrated in FIG. 2. For example, the photolithography system 1000 may further include a sensor that is used to measure a height and a slope of a surface of a substrate, e.g. wafer WF.

The light source 1200 may generate a light. The light illuminated from the light source 1200 may be emitted to the mask 1400. For example, the light source 1200 may include an ultraviolet light source (e.g., KrF light source having a wavelength of 234 nm, an ArF light source having a wavelength of 193 nm, or the like). For example, the light source 1200 may further include a collimator (not illustrated). The collimator may convert ultraviolet rays into a collimated light or parallel rays. The collimated light may be provided to the mask 1400. For example, the collimator may include a dipole aperture or a quadruple aperture used to make the depth of focus of the ultraviolet rays high.

The mask 1400 may include image patterns that are used to print a layout on the wafer WF. The image patterns may be formed of a transparent area and an opaque area. The transparent area may be formed by etching a metal layer on the mask 1400. The transparent area may transmit a light illuminated from the light source 1200. In contrast, the opaque area may not transmit a light. The mask 1400 may be manufactured based on the optical proximity correction according to some example embodiments of inventive concepts. The optical proximity correction of inventive concepts will be described in detail later.

The reduction projection device 1600 may receive a light that passes through the transparent area of the mask 1400. The reduction projection device 1600 may be or include a lens. The reduction projection device 1600 may match circuit patterns of a layout to be printed on the substrate (e.g. wafer WF) with the image patterns of the mask 1400. The wafer stage 1800 may support the substrate/wafer WF.

The transparent area included in the image patterns of the mask 1400 may transmit a light illuminated from the light source 1200. The light passing through the mask 1400 may be transmitted onto the substrate/wafer WF through the reduction projection device 1600. The substrate/wafer WF may have a light-sensitive material, such as a photoresist material, on the surface, and the light-sensitive material may be exposed to the light produced by the light source 1200. Furthermore, components/other layers on the substrate/wafer WF may be removed, e.g. may be etched, or may be added, e.g. may be deposited. As a result, a layout including circuit patterns corresponding to the image patterns of the mask 1400 may be patterned/printed on the substrate/wafer WF.

However, as the degree of integration of the semiconductor process increases, a distance between image patterns of the mask 1400, e.g. between neighboring image patterns of the mask 1400, gradually becomes very close, and a width of the transparent area gradually becomes narrow. Because of this "proximity", the interference and diffraction of light occur, and a distorted layout different from a target layout may be printed on the substrate/wafer WF. When the distorted layout is printed on the substrate/wafer WF, a designed circuit may abnormally operate.

A resolution enhancement technology is used to prevent the layout from being distorted and/or to reduce the amount of distortion. Optical proximity correction is an example of the resolution enhancement technology. Based on the optical proximity correction, the degree of distortion such as the interference and diffraction of light is estimated in advance. Alternatively or additionally, based on the estimated result, the image patterns to be formed on the mask 1400 may be biased in advance. As such, the target layout may be printed on the substrate/wafer WF.

In the optical proximity correction according to some example embodiments of inventive concepts, a hash value of each of segments constituting a layer, e.g. a level of the semiconductor device, is calculated based on a characteristic of the corresponding segment itself and a surrounding condition. The hash value may be or correspond to a numerical value, such as a 256-bit numerical value. A representative value is calculated based on bias values of segments having the same hash value. The representative value may be allocated to the segments having the same hash values. Segments having the same hash value may be biased the same, or in a similar manner, based on the representative value. As such, the optical proximity correction may be more uniformly performed on patterns having the same shape and the same surrounding condition, and the mask 1400 that closely resembles an intended mask may be provided.

Below, example embodiments of inventive concepts will be described. In the following description, it is assumed that model-based optical proximity correction using a computer simulation is performed. However, this assumption is not intended to limit inventive concepts. Example embodiments may be applied to other types of resolution enhancement technology by one of ordinary skill in the art.

Figure 3:
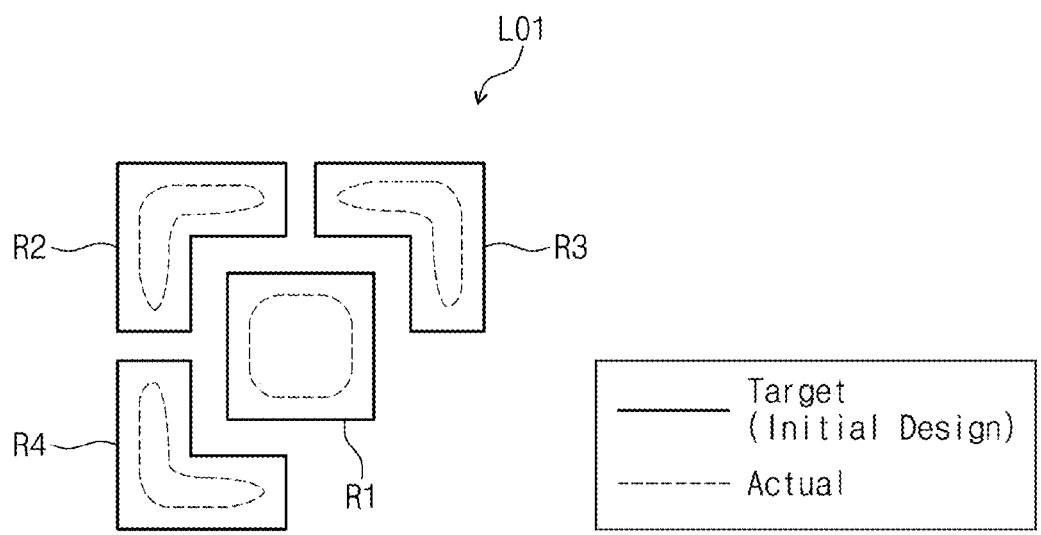
FIG. 3 conceptually illustrates a layout formed on a substrate.

FIG. 3 conceptually illustrates a layout formed on a substrate such as a wafer. In some example embodiments, a layout L01 may include a first circuit pattern R1 to a fourth circuit pattern R4. A shape of the layout L01 illustrated in FIG. 3 is an example for better understanding of inventive concepts and is not intended to limit inventive concepts.

An area defined by a solid line may indicate a target layout to be printed/patterned on the substrate/wafer WF. For example, a designer of the layout L01 may intend to print the layout L01 of the first circuit pattern R1 to the fourth circuit pattern R4 defined by the solid line of FIG. 3 on the substrate/wafer WF. That is, the solid line in FIG. 3 indicates a layout to be printed/patterned as the target layout. The target layout is provided as an initial design layout.

In contrast, an area defined by a dotted line may indicate a layout to be actually printed on the substrate/wafer WF. Distortion such as the interference and diffraction of light may occur by the mask 1400 of FIG. 2 in the process of manufacturing a semiconductor device actually. Unlike the intention of the designer, because of the distortion, the first circuit pattern R1 to the fourth circuit pattern R4 defined by the dotted lines of FIG. 3 may be printed on the substrate/wafer WF. When the distorted layout is printed on the substrate/wafer WF, the designed circuit may abnormally operate.

To prevent the layout from being distorted or to reduce the amount of distortion, optical proximity correction may be performed. In optical proximity correction, the design layout may be biased to reduce an error between an actual layout to be actually printed and a target layout based on the design layout. An example of the optical proximity correction will be described with reference to FIGS. 4 and 5.

Figure 4:
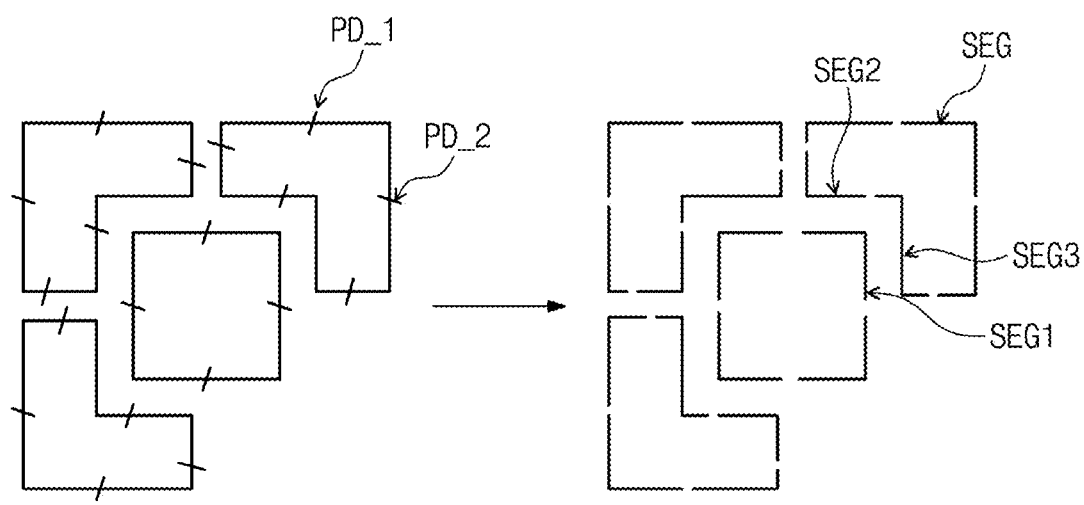
FIG. 4 conceptually illustrates a process of dividing an outline of a layout into a plurality of segments in optical proximity correction.

FIG. 4 conceptually illustrates a process of dividing an outline of a layout into a plurality of segments in optical proximity correction. In some example embodiments, a process of dividing the outline of the design layout L01 corresponding to the solid line of FIG. 3 into a plurality of segments is described.

A plurality of division points may be set on the outline of the design layout L01. For example, a first division point PD_1 and a second division point PD_2 may be set on the outline of the design layout L01. For example, one segment may be obtained based on the first division point PD_1 and the second division point PD_2. Other segments, such as segment SEG1, segment SEG2, and segment SEG3 may be obtained from other division points. As in the above description, the outline of the design layout L01 may be divided into a plurality of segments based on a plurality of division points. A segment may mean or correspond to a small unit, e.g. a minimum unit by which a bias is made.

Here, the term "division" is used, but division does not mean physical division. In FIG. 4, an example is illustrated as a plurality of segments are physically divided, but the example is conceptually provided for better understanding of inventive concepts, and division may correspond to a logical division of the outline of the design layout L01.

In optical proximity correction, each of the divided segments may be or correspond to a biasing target. The divided segments may be biased independently of each other. For example, the segment SEG may be biased along one of a first direction (e.g., an outward direction of each circuit pattern corresponding to a plurality of segments) and a second direction (e.g., an inward direction of each circuit pattern corresponding to a plurality of segments), independently of the remaining segments. Each of the divided segments may be biased to reduce an error between an actual layout and a target layout. For example, a bias may include addition of and/or removal of a serif component (or a dog-ear component) to the individual segments.

The process of calculating bias values is known to those of ordinary skill in the art, and thus, additional description will be omitted to avoid redundancy. Each of the segments may be biased based on the calculated bias values. An example of an updated design layout obtained based on the biased segments will be described with reference to FIG. 5.

Figure 5:
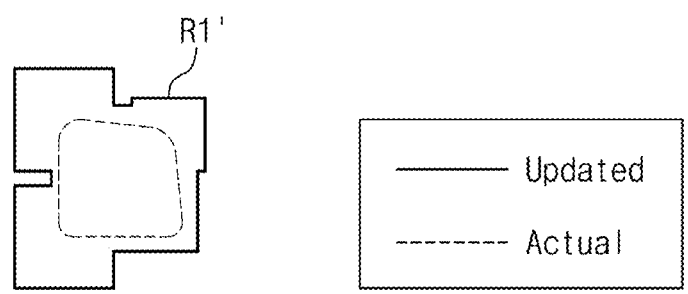
FIG. 5 conceptually illustrates a design layout updated by optical proximity correction.

FIG. 5 conceptually illustrates a design layout updated by optical proximity correction. For better understanding of inventive concepts, a first new circuit pattern R1' updated from the first circuit pattern R1 of FIG. 3 will be described. Descriptions corresponding to the second circuit pattern R2 to the fourth circuit pattern R4 are omitted.

A solid line of FIG. 5 may indicate the first biased pattern R1' included in an updated design layout. According to the process described with reference to FIG. 4, the outline of the first circuit pattern R1 of FIG. 3 may be divided into a plurality of segments, and each of, or at least one of, the divided segments may be biased. As illustrated in FIG. 5, each of the segments may be biased along one of the first direction (e.g., the outward direction) and the second direction (e.g., the inward direction). For example, the bias may include addition of serifs/dog-ears to the segments. As such, the first biased pattern R1' may be obtained.

Each of the divided segments may be biased to reduce an error between an actual layout and a target layout. For example, a dotted line of FIG. 5 may indicate an actual layout to be actually printed based on the updated design layout. The error between the actual layout and the target layout may be reduced by biasing each of the divided segments. For example, the root-mean-square error between the actual layout corresponding to the solid line around region R1 of FIG. 3, and the actual layout corresponding to the dashed line in FIG. 5, may be reduced.

However, referring to FIGS. 3 and 4, a left top segment, a left bottom segment, and a right top segment of the first circuit pattern R1 have the same surrounding condition. Accordingly, it is desirable that the left top segment, the left bottom segment, and the right top segment of the first circuit pattern R1 have the same bias value. Nevertheless, referring to FIG. 5, it may be understood that the left top segment, the left bottom segment, and the right top segment of the first biased pattern R1' are biased asymmetrically.

Of course, FIGS. 2 to 4 are only examples. However, in the actual optical proximity correction, because of an error of the numerical calculation, there is the probability that segments having the same surrounding condition are differently biased. In particular, the error may be accumulated as the process of calculating bias values respectively corresponding to the divided segments is repeated. When the design layout distorted due to the accumulated error is printed on the substrate/wafer WF, the designed circuit may abnormally operate unlike the intention of the designer.

Accordingly, in some example embodiments of inventive concepts, a hash value of a segment is calculated in consideration of a characteristic of the specific segment and a characteristic(s) of a surrounding segment(s). With regard to two segments, in a case where characteristics of the two segments are identical and characteristics of segments adjacent to the two segments are identical, hash values of the two segments may be identical. A representative value may be calculated from bias values of the segments having the same hash values. Accordingly, the optical proximity correction may be uniformly or more uniformly performed.

Figure 6:
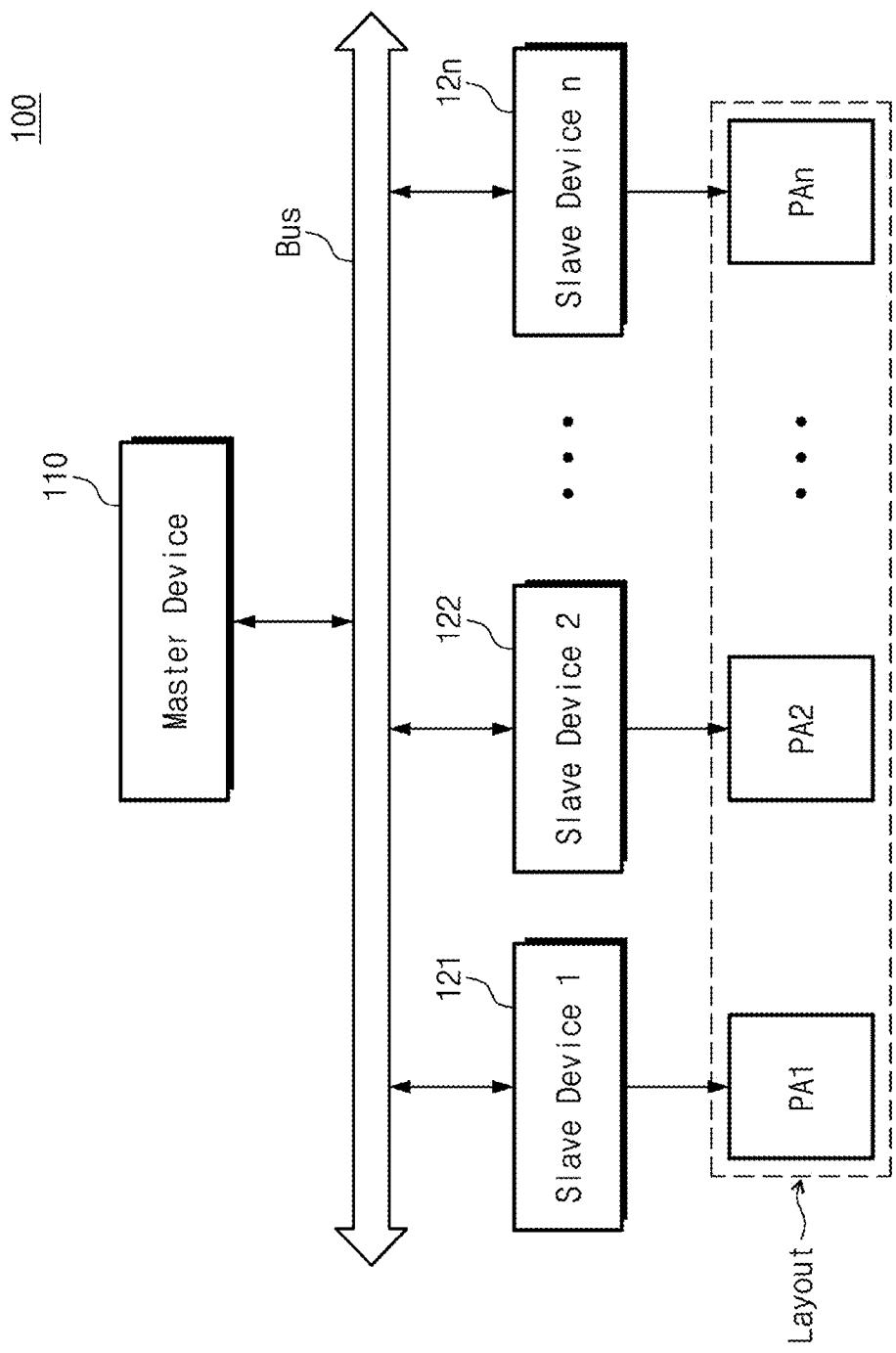
FIG. 6 illustrates a system for performing optical proximity correction according to some example embodiments of inventive concepts.
Figure 7:
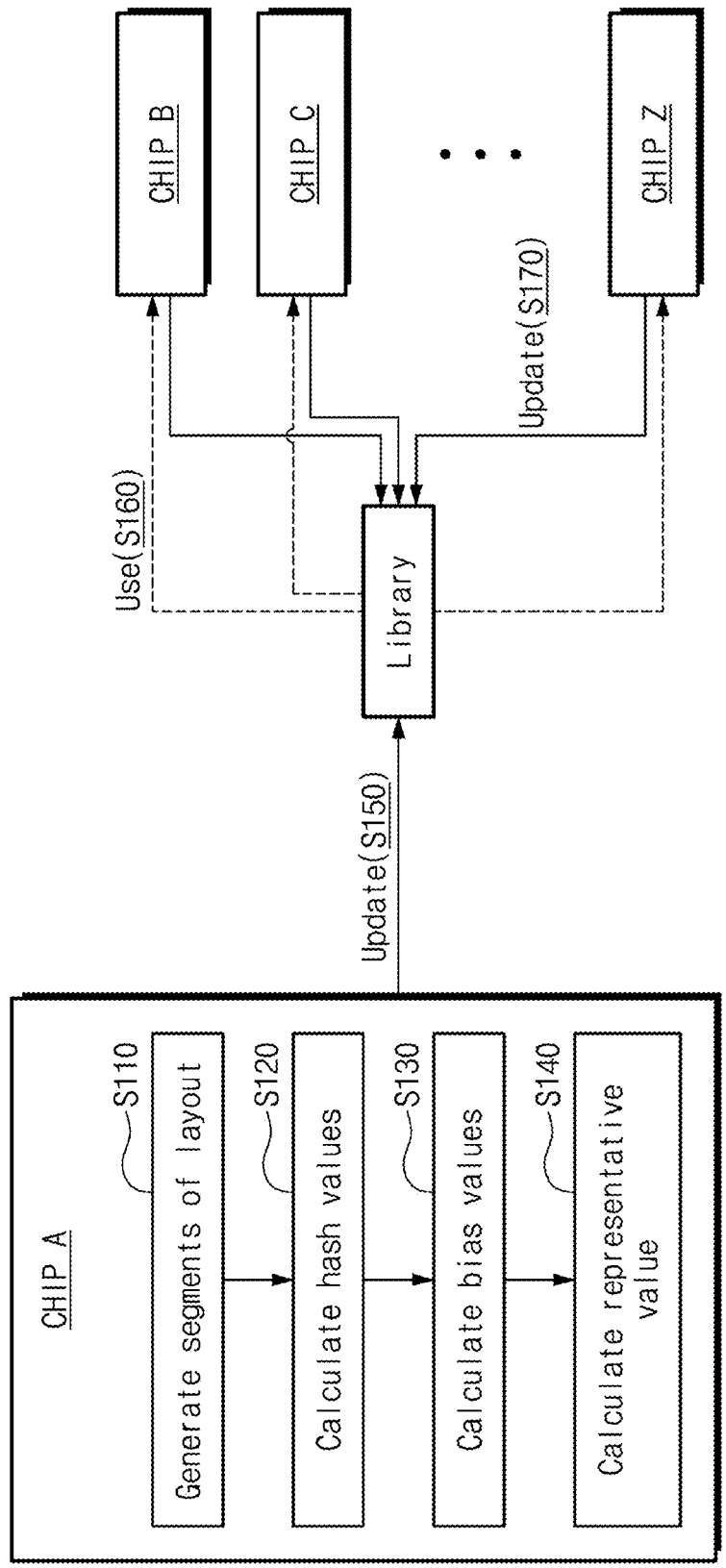
FIG. 7 illustrates a method for executing optical proximity correction according to some example embodiments of inventive concepts.
Figure 8:
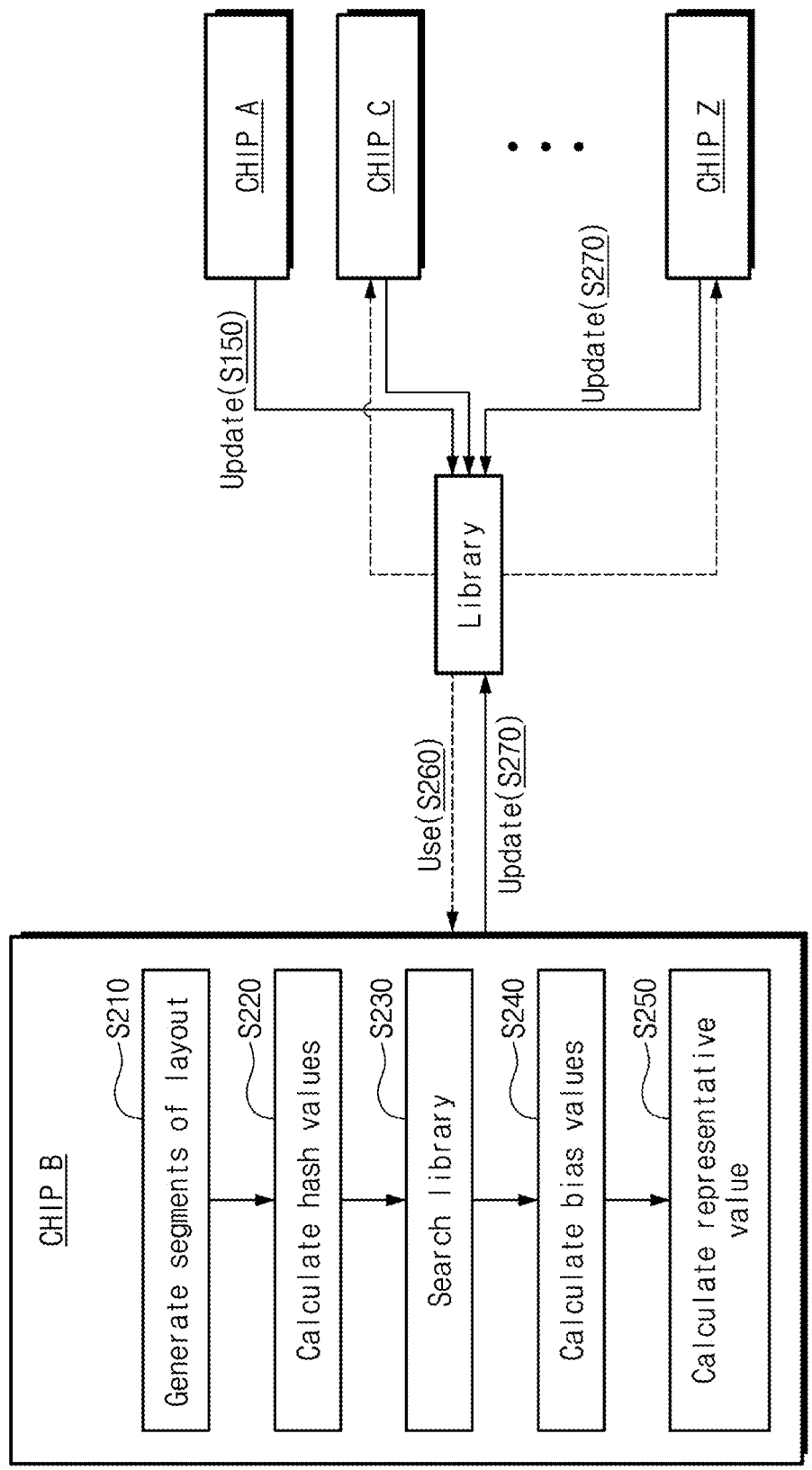
FIG. 8 illustrates a method for executing optical proximity correction according to some example embodiments of inventive concepts.

FIG. 6 illustrates a system for performing optical proximity correction according to some example embodiments of inventive concepts. FIG. 7 illustrates a method for executing optical proximity correction according to some example embodiments of inventive concepts. For example, FIG. 7 may illustrate a detailed embodiment of the optical proximity correction performed in operation S13 of FIG. 1. FIG. 8 illustrates a method for executing optical proximity correction according to some example embodiments of inventive concepts.

In some example embodiments, a system 100 of FIG. 6 includes a master device 110 and a plurality of slave devices 121 to 12n. For example, the master device 110 and the slave devices 121 to 12n may be implemented with separate computing devices. Alternatively or additionally, each of the master device 110 and at least one of the slave devices 121 to 12n may be implemented with a plurality of processor cores.

Although not illustrated in drawings, the system 100 may further include a storage medium in which an OPC tool for executing the optical proximity correction is stored. The system 100 may further include a memory onto which the OPC tool is loaded, when executing the OPC tool.

In some example embodiments, the OPC tool that performs the optical proximity correction of inventive concepts may be or correspond to a computer program product including a computer-readable program code, and/or may be a computer program product including a non-transitory computer-readable medium in which the computer-readable program code is stored. Alternatively or additionally, the OPC tool that performs the optical proximity correction of inventive concepts may be a product that is capable of being downloaded through the Internet.

A method for the optical proximity correction of inventive concepts described with reference to FIGS. 6 and 7 together. As the master device 110 drives the OPC tool, the optical proximity correction may be executed on a layout of at least one layer on a semiconductor chip "A". The master device 110 may be provided with the layout of the at least one layer of the semiconductor chip "A". For example, the layout of the semiconductor chip "A" may be a result of the layout design operation S12 of FIG. 1. The layout may include a plurality of circuit patterns.

The master device 110 may divide the layout of the semiconductor chip "A" into a plurality of patches PA1 to PAn. For example, a patch may be a minimum unit that is processed by a slave device. The master device 110 may allocate the patches PA1 to PAn of the semiconductor chip "A" to the slave devices 121 to 12n, respectively. Each slave device may process the allocated patch. In some example embodiments, the processing of the first patch PA1 by the first slave device 121 is described.

The first slave device 121 may generate segments based on a layout included in the first patch PA1 (S110). The process of generating segments is described with reference to FIG. 4.

The first slave device 121 may calculate hash values of the segments of the first patch PA1 (S120). For example, a hash value may reflect a characteristic of a specific segment, and a characteristic of at least one segment adjacent to the segment. For example, segments having the same characteristic and the same surrounding condition may have the same hash value, e.g. may hash onto the same hash value. A factor deciding a hash value will be more fully described with reference to FIGS. 9 and 10.

The first slave device 121 may calculate bias values of the segments constituting or associated with the first patch PA1 (S130). A bias value of a segment may be obtained based on a result of simulating a grid being a minimum simulation unit of the OPC tool. For example, as the size of the grid increases, a time taken to obtain a bias value may become shorter, but less fine bias values may be obtained. In more detail, the consistency of segments having the same surrounding condition may weaken. In contrast, as the size of the grid decreases, a time taken to obtain a bias value may become longer, but a finer bias value may be obtained. In more detail, the consistency of segments having the same surrounding condition may be reinforced. Meanwhile, the process of calculating a bias value, e.g. a size of an added or removed serif, is well known to those of ordinary skill in the art, and thus, additional description will be omitted to avoid redundancy.

The master device 110 may collect hash values and bias values calculated by the first slave device 121. The master device 110 may calculate a representative value based on the collected hash values and bias values (S140). As described with reference to FIG. 5, even though segments have the same surrounding condition, bias values of the segments may be different. Therefore, to maintain consistency, the master device 110 may calculate a representative value from bias values of segments having the same hash value. For example, the representative value may be, but is not limited to, an average value, e.g. some measure of central tendency, of the bias values of the segments having the same hash value.

The master device 110 may update the representative value corresponding to the segments having the same hash value (S150) in a library. For example, the library may include hash values and bias values respectively corresponding to the hash values. The master device 110 may update a bias value of a segment having a unique hash value (not matched with any other hash value) in the library. The master device 110 may generate a biased pattern based on the library.

The same bias value (e.g., a representative value) is applied to segments having the same hash value from among segments of the corresponding layer of semiconductor chip "A". Therefore, consistency, or more consistency, between patterns having the same surrounding condition from among a plurality of patches of the semiconductor chip "A" may be maintained. However, inventive concepts are not limited to the example in which consistency is maintained between a plurality of patches of the same chip or of the same layer in the same chip. For example, consistency between semiconductor chips may be maintained. For example, the above processes may be similarly applied to a semiconductor chip "B" to a semiconductor chip "Z", and thus, consistency between semiconductor chips may be maintained. This will be described with reference to FIGS. 6 and 8.

Referring to FIGS. 6 and 8, a library may be updated depending on the optical proximity correction performed on the semiconductor chip "A" (S150).

Afterwards, to perform optical proximity correction on the semiconductor chip "B", the master device 110 may be provided with a layout of the semiconductor chip "B". The master device 110 may divide the layout of the semiconductor chip "B" into a plurality of patches PA1 to PAn. The master device 110 may allocate the patches PA1 to PAn of the semiconductor chip "B" to the slave devices 121 to 12n, respectively.

The slave devices 121 to 12n may process the patches PA1 to PAn of the semiconductor chip "B", respectively. Descriptions of how the first slave device 121 processes the first patch PA1 is presented below for brevity. The first slave device 121 may generate segments based on a layout included in the first patch PA1 (S210). The first slave device 121 may calculate hash values of the segments of the first patch PA1 (S220).

A library may be searched based on the hash values calculated in operation S220 (S230). In some example embodiments, the first slave device 121 may transmit the calculated hash values to the master device 110. The master device 110 may compare the hash values received from the first slave device 121 with hash values stored in the library. Based on the comparison result, the master device 110 may determine whether a hash value is stored in the library.

When the search result indicates that a hash value is stored in advance in the library, there is no need or no reason to newly calculate a bias value of a segment(s) corresponding to the hash value stored in the library. Accordingly, in the case of generating a biased layout for the semiconductor chip "B", the bias value stored in the library may be used without modification (S260).

In contrast, when the search result indicates that a hash value is not stored in advance in the library, there is a need or reason to newly calculate a bias value of a segment(s) corresponding to the hash value not stored in the library. For example, the master device 110 may command/direct the first slave device 121 to calculate a bias value of the corresponding segment, and the first slave device 121 may calculate a bias value (S240). Operation S240 may be performed by each of the slave devices 121 to 12n processing the patches PA1 to PAn of the semiconductor chip "B". The slave devices 121 to 12n may transmit the calculated bias values and the hash values corresponding to the calculated bias values to the master device 110.

The master device 110 may calculate a representative value based on the hash values and the bias values (S250). The master device 110 may update the representative value corresponding to segments having the same hash value in the library (S270). The updated representative value (or bias value) may be applied when there are generated biased layouts for the semiconductor chip "A" and the semiconductor chip "C" to the semiconductor chip "Z", as well as the semiconductor chip "B". For example, the consistency between semiconductor chips may also be maintained.

Meanwhile, example embodiments corresponding to FIG. 8 may have a relatively short library generation time compared with example embodiments of FIG. 7. A reason may be that the process of calculating a bias value of a segment having a hash value identical to one of hash values stored in advance in the library is omitted. Accordingly, making the size of the grid being a minimum simulation unit smaller may be possible, when a bias value of a segment of the semiconductor chip "B" is calculated. By reducing the size of the grid, even though a simulation time increases, a trade-off between a secured library generation time and a simulation time may be possible.

Figure 9:
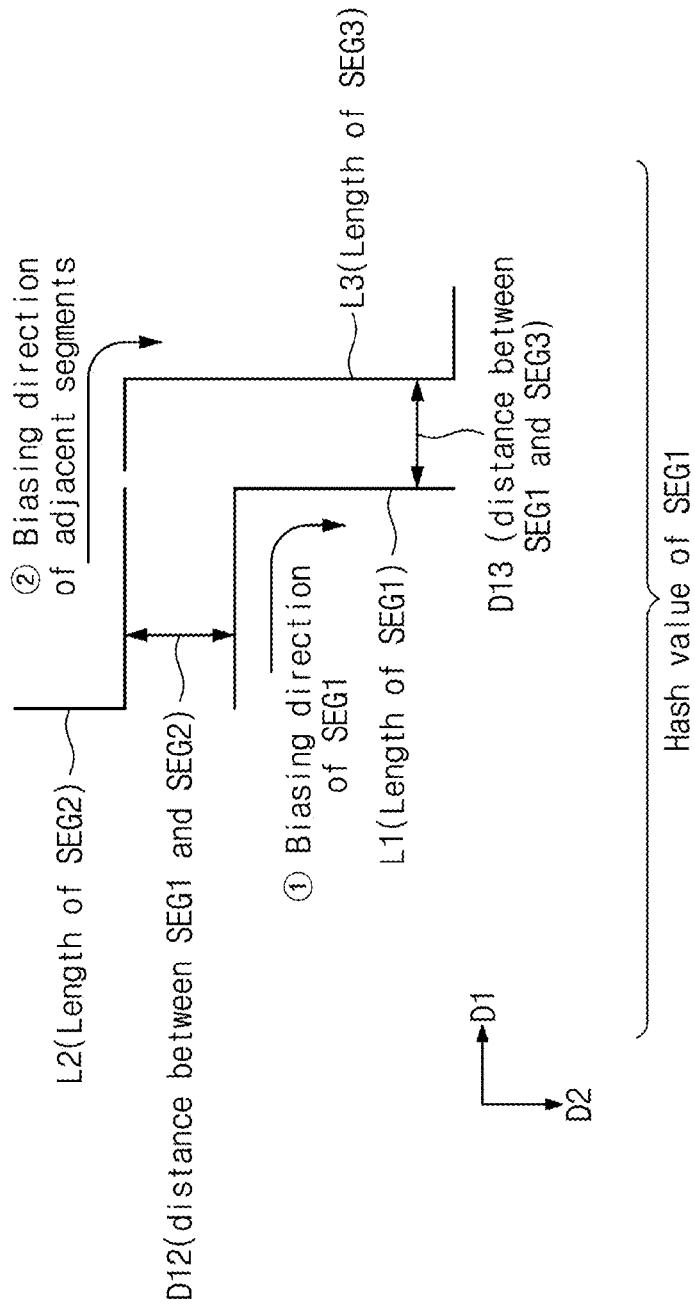
FIG. 9 conceptually illustrates elements/factors deciding a hash value of a segment according to some example embodiments of inventive concepts.

FIG. 9 conceptually illustrates elements/factors deciding a hash value of a segment according to some example embodiments of inventive concepts. In some example embodiments, segments illustrated in FIG. 9 correspond to segments SEG1, SEG2, and SEG3 illustrated in FIG. 4. The first segment SEG1 may correspond to the first circuit pattern R1 of FIG. 3, and the second segment SEG2 and the third segment SEG3 may correspond to the third circuit pattern R3 of FIG. 3.

A hash function that depends on a plurality of elements/factors may be used to calculate a hash value of the first segment SEG1. The plurality of elements/factors may be associated with a value of a specific segment, and a condition associated with segments surrounding the specific segment. For example, elements/factors affecting a hash value may include a first characteristic value associated with a characteristic of a specific segment itself. The elements/factors affecting the hash value may include a second characteristic value associated with a characteristic of an adjacent segment contiguous to the specific segment. Also, the elements/factors affecting the hash value may include a third characteristic value associated with a characteristic between the specific segment and the adjacent segment. As a result, segments that have the same surrounding condition and the same attributes may have the same hash value.

A length L1 of the first segment SEG1 may be adopted as an element deciding the hash value of the first segment SEG1. The length L1 of the first segment SEG1 includes a length in a first direction D1 and/or a length in a second direction D2. For example, as illustrated in FIG. 9, in the case where the first segment SEG1 is composed of a component in the first direction D1 contiguous with a component in the second direction D2, each of the component in the first direction D1 and the component in the second direction D2 may independently act as an element or factor deciding a hash value. Accordingly, a direction in which each component extends may also be adopted as an element. Therefore, even though there are segments of which overall lengths are identical, when lengths in the first direction D1 are different or lengths in the second direction D2 are different, hash values of the segments may be different.

A biasing direction ① of the first segment SEG1 may be adopted as an element or factor deciding the hash value of the first segment SEG1. The biasing direction may mean an order of a segment to be simulated by the OPC tool in units of a grid. For example, four segments constituting one circuit pattern (e.g., R1 of FIG. 3) may have the same biasing direction. Some example embodiments are illustrated in FIG. 9 as segments constituting or corresponding to a circuit pattern(s) (e.g., R1 of FIG. 3) are sequentially biased in a clockwise direction. For example, a biasing direction when segments are biased in a clockwise direction may have a first value, and a biasing direction when segments are biased in a counterclockwise direction may have a second value. A biasing direction ② of adjacent segments may be adopted as an element or factor deciding a temporary hash value of the second segment SEG2 and the third segment SEG3.

Distances D12 and D13 between the first segment SEG1 and adjacent segments may be adopted as an element (e.g. a factor) deciding the hash value of the first segment SEG1. Here, an adjacent segment may mean a segment disposed within a distance having an influence on the first segment SEG1 associated with optical proximity correction. Additionally, the adjacent segment may mean an adjacent circuit pattern that does not belong to a circuit pattern (e.g., R1 of FIG. 3) to which the first segment SEG1 belongs. For example, the adjacent segment may be referred to as at least a part (e.g., SEG2 and SEG3) of segments that belong to a circuit pattern (e.g., R3 of FIG. 3) adjacent to the circuit pattern (e.g., R1 of FIG. 3) to which the first segment SEG1 belongs.

Each of lengths L2 and L3 of the adjacent segments SEG2 and SEG3 may be adopted as another element or factor deciding the hash value of the first segment SEG1. The lengths L2 and L3 of the adjacent segments SEG2 and SEG3 includes a length in the first direction D1 and/or a length in the second direction D2. For example, as illustrated in FIG. 9, in the case where the surrounding segment SEG2 or SEG3 is composed of a component in the first direction D1 and a component in the second direction D2, each of the component in the first direction D1 and the component in the second direction D2 may independently act as an element or factor deciding a hash value.

A hash value of the first segment SEG1 may be calculated in overall consideration of the above elements/factors. For example, a slave device may calculate the hash value of the first segment SEG1 through a hash function that uses the above elements/factors as an independent variable.

Figure 10:
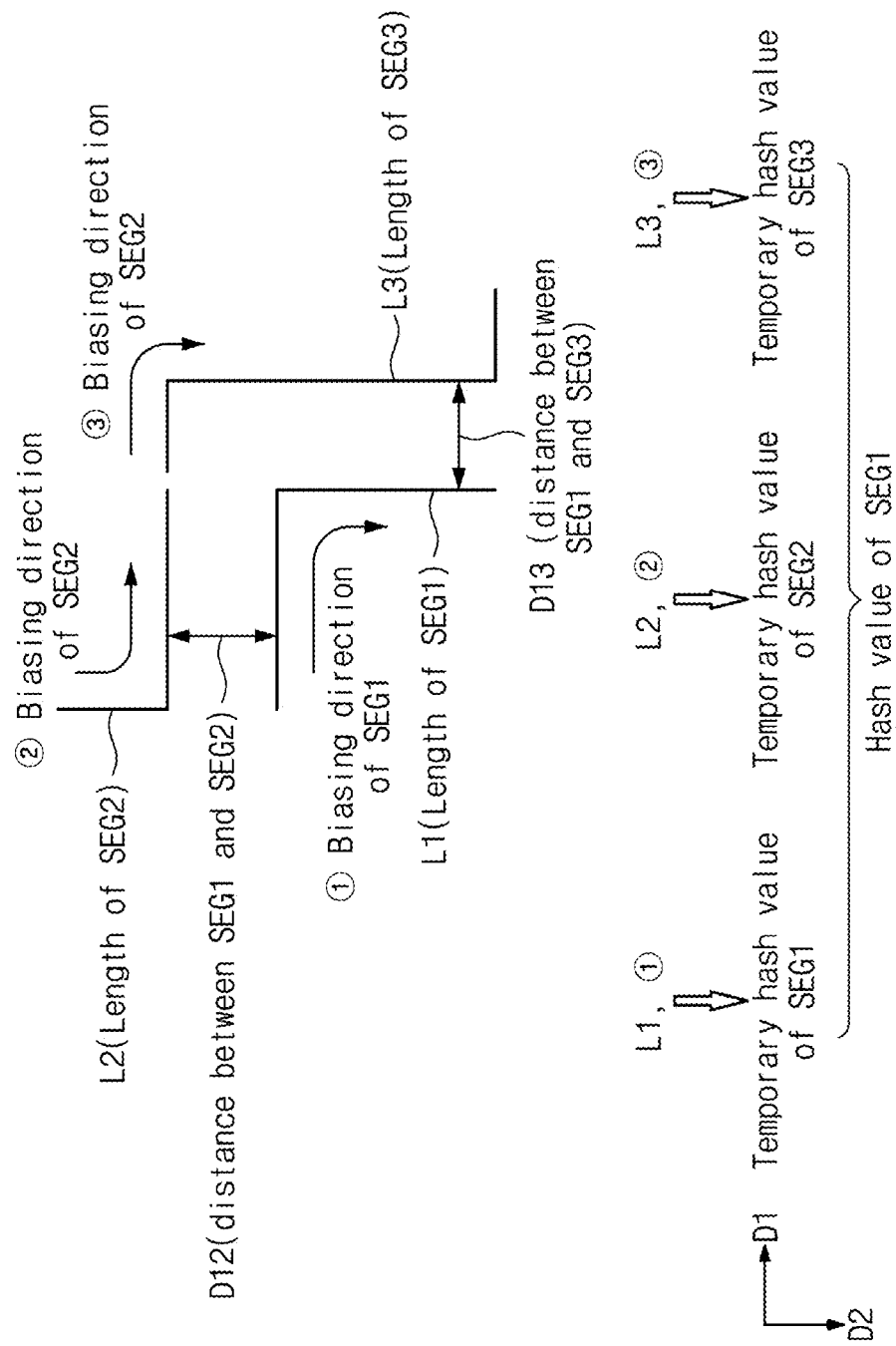
FIG. 10 conceptually illustrates elements/factors deciding a hash value of a segment according to some example embodiments of inventive concepts.

FIG. 10 conceptually illustrates elements/factors deciding a hash value of a segment according to some example embodiments of inventive concepts. Unlike the embodiment of FIG. 9, in the embodiment of FIG. 10, a temporary hash value is calculated in consideration of only an element or factor associated with a segment itself. Afterwards, a final hash value is calculated based on a distance between temporary hash values and segments.

A biasing direction ① and a length L1 of the first segment SEG1 may be adopted as an element or factor deciding a temporary hash value of the first segment SEG1. In the length L1, both a component in the first direction D1 and a component in the second direction D2 may have an influence on a hash value independently. A slave device (e.g., one of 121 to 12n of FIG. 6) may calculate the temporary hash value of the first segment SEG1 in consideration of a length of the first segment SEG1 in the first direction D1 and/or a length of the first segment SEG1 in the second direction D2 and an order (e.g., a clockwise direction) of the first segment SEG1 to be simulated by the OPC tool in units of a grid.

A biasing direction ② and a length L2 of the second segment SEG2 may be adopted as an element or factor deciding a temporary hash value of the second segment SEG2. The slave device may calculate the temporary hash value of the second segment SEG2 in consideration of a length of the second segment SEG2 in the first direction D1 and/or a length of the second segment SEG2 in the second direction D2 and an order (e.g., a counterclockwise direction) of the second segment SEG2 to be simulated by the OPC tool in units of a grid.

A biasing direction ③ and a length L3 of the third segment SEG3 may be adopted as an element or factor deciding a temporary hash value of the third segment SEG3. The slave device may calculate the temporary hash value of the third segment SEG3 in consideration of a length of the third segment SEG3 in the first direction D1 and/or a length of the third segment SEG3 in the second direction D2, and/or an order (e.g., a counterclockwise direction) of the third segment SEG3 to be simulated by the OPC tool in units of a grid.

Hash values of the segments SEG1, SEG2, and SEG3, a distance D12 between the first segment SEG1 and the second segment SEG2, and a distance D13 between the first segment SEG1 and the third segment SEG3 may be considered to calculate a final hash value of the first segment SEG1. For example, the slave device may calculate the final hash value of the first segment SEG1 in consideration of at least one of the temporary hash value of the second segment SEG2, the temporary hash value of the third segment SEG3, or the distances D12 and D13 to the temporary hash value of the first segment SEG1.

However, when the final hash value of the first segment SEG1 is calculated, in the case where a distance between the first segment SEG1 and the adjacent segment SEG2 or SEG3 exceeds a threshold value, a corresponding hash value may not be applied to calculate the final hash value of the first segment SEG1. Here, the threshold value may be or may correspond to a distance that does not have an influence on a simulation using the OPC tool.

Figure 11:
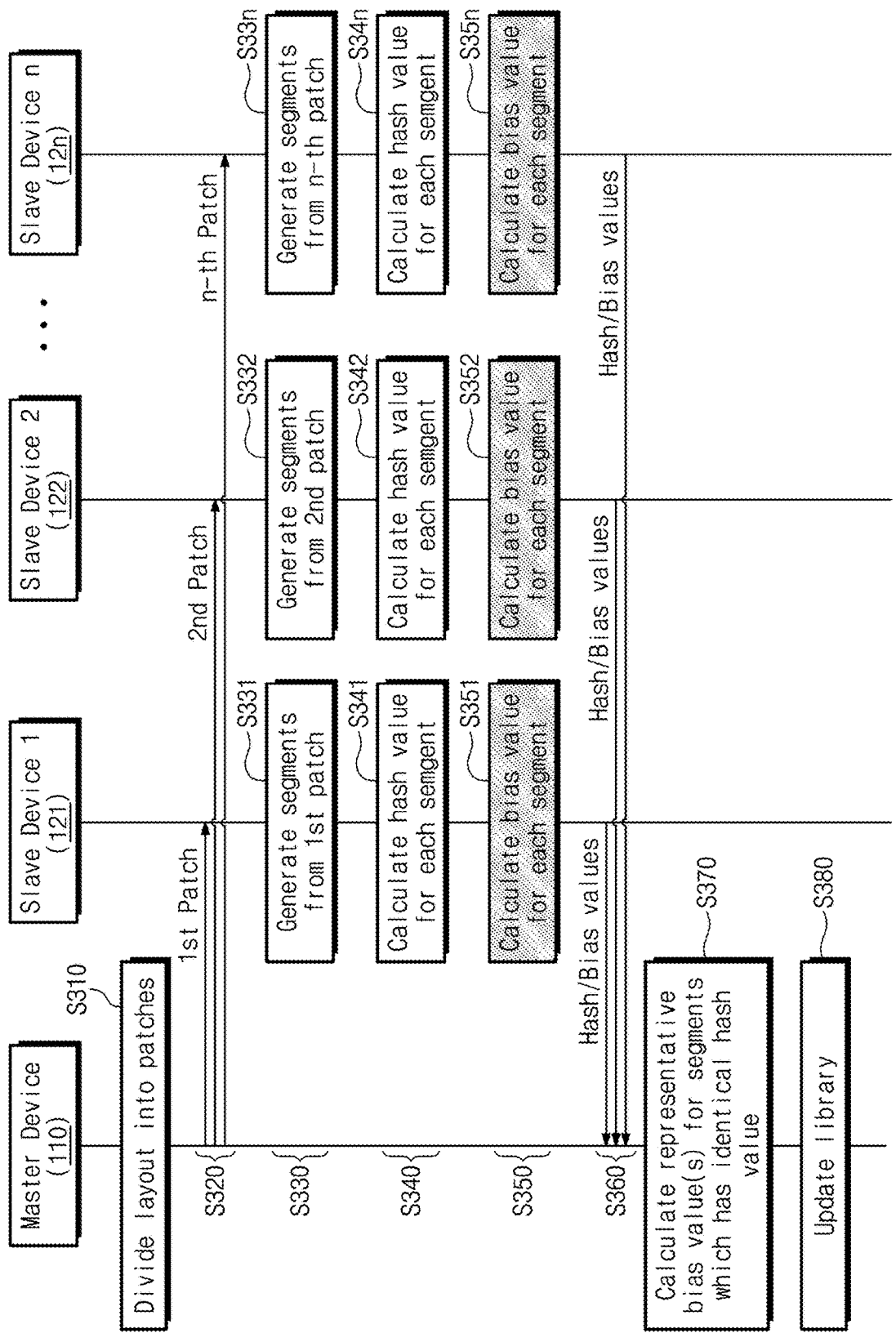
FIG. 11 illustrates a method for executing optical proximity correction according to some example embodiments of inventive concepts.

FIG. 11 illustrates a method for executing optical proximity correction according to some example embodiments of inventive concepts. Some example embodiments of FIG. 11 shows processing procedures that are performed on the semiconductor chip "A" illustrated in FIG. 7 in detail.

In operation S310, the master device 110 may divide the layout of the semiconductor chip "A" into the plurality of patches PA1 to PAn. In operation S320, as described with reference to FIG. 4, the master device 110 may allocate the divided patches PA1 to PAn to the plurality of slave devices 121 to 12n, respectively. In operation S330 to operation S350, each slave device may process the allocated patch.

In some example embodiments, the first slave device 121 may generate a plurality of segments from the first patch PA1 (S331). The first slave device 121 may calculate hash values of the generated segments, respectively (S341). For example, the first slave device 121 may calculate the hash value of each segment in various manners as described with reference to FIG. 9 or 10. The above operations may be similarly performed by each of the second slave device 122 to the n-th slave device 12n.

In operation S351, the first slave device 121 may calculate a bias value of each segment. The bias value may be obtained based on results of simulating grids each being, or corresponding to, a minimum simulation unit of the OPC tool. Each of the second slave device 122 to the n-th slave device 12n may calculate a bias value of each segment of the allocated patch.

In operation S360, the master device 110 may collect the hash values and the bias values calculated by the slave devices 121 to 12n.

In operation S370, the master device 110 may generate a representative value for segments having the same hash value. For example, the representative value may be obtained from the bias values of the segments having the same hash value. For example, the representative value may be or correspond to, but is not limited to, an average value as some measure of central tendency of the bias values of the segments having the same hash value. For example, the representative value may be or correspond to, but is not limited to, a mean value of the bias values of the segments having the same hash value. For example, the representative value may be or correspond to a median or a mode of the bias values of the segments having the same hash value.

In operation S380, a library may be updated. For example, a representative value of biased values of segments having the same hash value may be stored in the library. A biased value of a segment having a hash value not matched with any other hash value, e.g. a biased value of a segment having a unique hash value, may be stored in the library.

Figure 12:
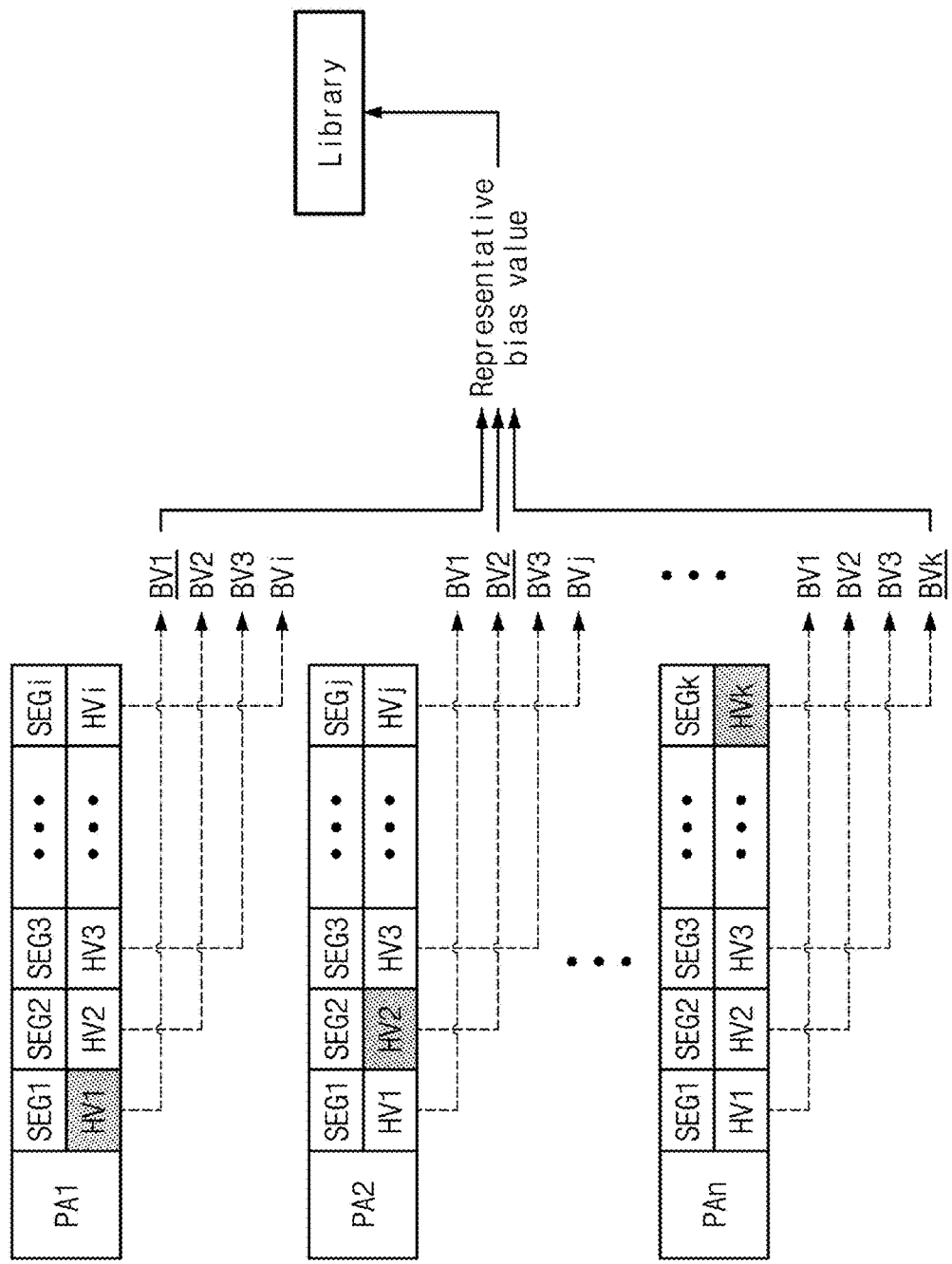
FIG. 12 conceptually illustrates how to calculate a representative value from bias values of segments of a plurality of patches.

FIG. 12 conceptually illustrates how to calculate a representative value from bias values of segments of a plurality of patches. For easy description, a description will be given with reference to FIG. 6 together.

The first slave device 121 generates segments SEG1 to SEGi from the first patch PA1 and calculates hash values HV1 to HVi respectively corresponding to each of the segments SEG1 to SEGi. The second slave device 122 generates segments SEG1 to SEGj from the second patch PA2 and calculates hash values HV1 to HVj respectively corresponding to each of the segments SEG1 to SEGj. As in the above description, the n-th slave device 12n generates segments SEG1 to SEGk from the n-th patch PAn and calculates hash values HV1 to HVk respectively corresponding to each of the segments SEG1 to SEGk.

The first slave device 121 may calculate bias values BV1 to BVi respectively corresponding to the segments SEG1 to SEGi. The second slave device 122 may calculate bias values BV1 to BVj respectively corresponding to the segments SEG1 to SEGj. As in the above description, the n-th slave device 12n may calculate bias values BV1 to BVk respectively corresponding to the segments SEG1 to SEGk.

The master device 110 may collect the hash values and the bias values of each patch and may calculate a representative value from bias values of segments having the same hash value. In some example embodiments, it may be assumed that hash values correspond to the hash value HV1 of the first segment SEG1 of the first patch PA1, the hash value HV2 of the second segment SEG2 of the second patch PA2, and the hash value HVk of the k-th segment SEGk of the n-th patch PAn. Here, the representative value may be or may correspond to, but is not limited to, an mean value, a median, or a mode. The calculated representative value may be updated at the library, and/or may be applied in common to segments having the same hash value.

According to example embodiments of FIG. 9 or 10, the first segment SEG1 of the first patch PA1, the second segment SEG2 of the second patch PA2, and the k-th segment SEGk of the n-th patch PAn, which have the same hash value, may be predicted as having the same surrounding condition. Accordingly, consistency between patches may be maintained by applying the same bias value to segments having the same surrounding condition, thus making it possible to normally operate the designed circuit depending on the intention of the designer, and/or improving the efficiency of OPC. For example, segments having the same hash value may be resized in a similar manner and/or may have the same or similar serifs applied (e.g. added thereto and/or removed therefrom), by an amount corresponding to the representative value, and consistency may be improved.

Figure 13:
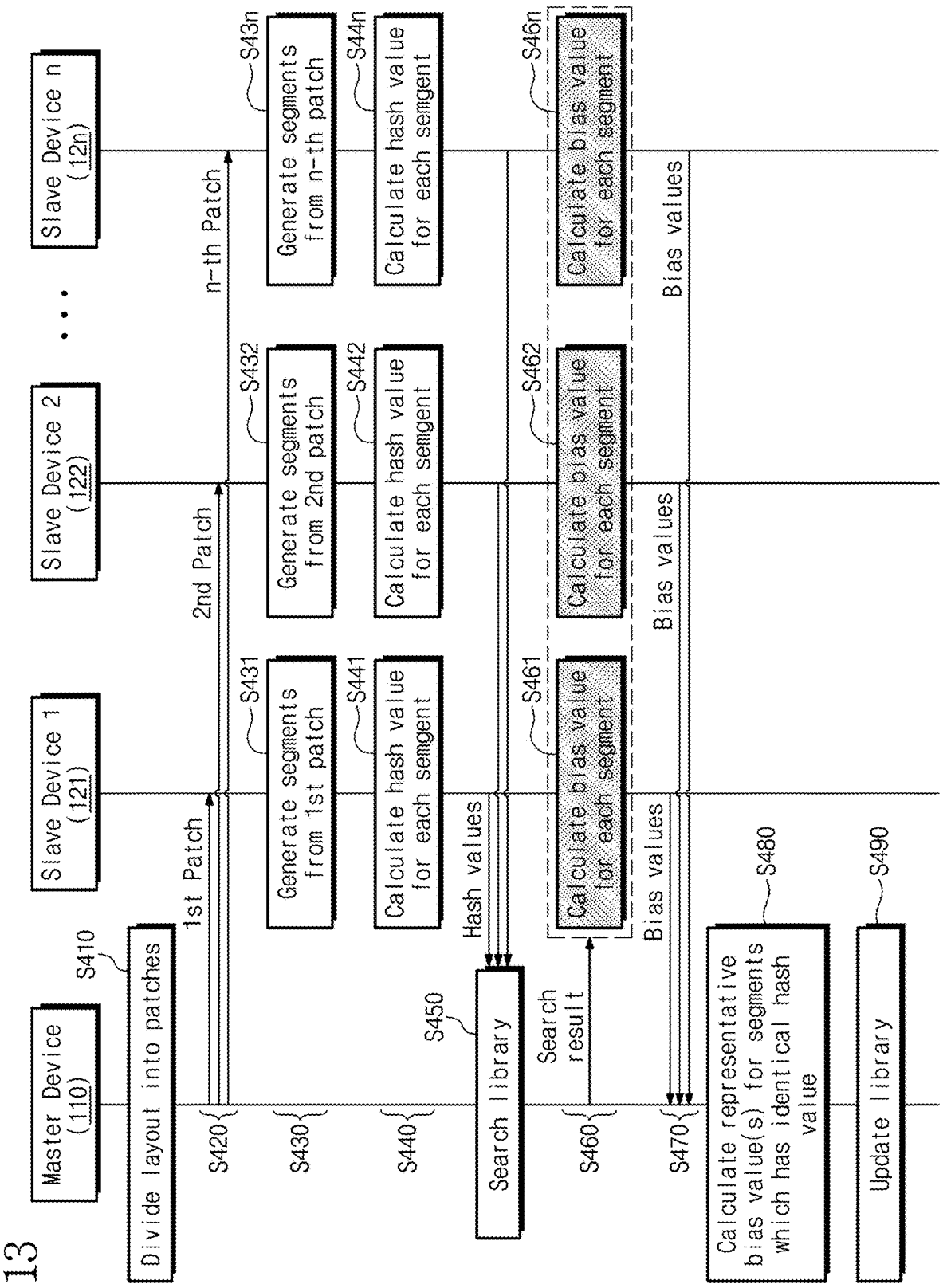
FIG. 13 illustrates a method for executing optical proximity correction according to some example embodiments of inventive concepts.

FIG. 13 illustrates a method for executing optical proximity correction according to some example embodiments of inventive concepts. Some example embodiments of FIG. 13 shows processing procedures that are performed on the semiconductor chip "B" illustrated in FIG. 8 in detail.

In operation S410, the master device 110 may divide the layout of the semiconductor chip "B" into the plurality of patches PA1 to PAn. In operation S420, as described with reference to FIG. 4, the master device 110 may allocate the divided patches PA1 to PAn to the plurality of slave devices 121 to 12n, respectively. In operation S430 to operation S440, each slave device may process the allocated patch.

In some example embodiments, the first slave device 121 may generate a plurality of segments from the first patch PA1 (S431). The first slave device 121 may calculate hash values of the generated segments, respectively (S441). For example, the first slave device 121 may calculate the hash value of each segment in various manners as described with reference to FIG. 9 or 10. The above operations may be similarly performed by the second slave device 122 to the n-th slave device 12n.

In operation S450, the master device 110 may receive the hash values from the slave devices 121 to 12n and may search a library based on the hash values. Here, the library may include the library associated with the semiconductor chip "A" (e.g., S380 of FIG. 11). The master device 110 may compare the hash values received from the slave devices 121 to 12n with a hash value stored in the library and may determine whether the optical proximity correction is required with regard to each segment of the semiconductor chip "B".

When the search result indicates that a value matched with a hash value received from the slave devices 121 to 12n is present in the library, there is no need/desire to calculate a bias value of a segment corresponding to the matched hash value. In contrast, when the search result indicates that a value matched with a hash value received from the slave devices 121 to 12n is absent from the library, there is a need/desire to calculate a bias value of a segment corresponding to the corresponding hash value.

In operation S460, the master device 110 may transmit the search result in operation S450 to the slave devices 121 to 12n. For example, with reference to the search result, the first slave device 121 may calculate a bias value of a segment not stored in the library from among the segments of the first patch PA1 (S461). As in the above description, the remaining slave devices 122 to 12n may calculate bias values of segments (S462 to S46n).

In operation S470, the master device 110 may collect the bias values calculated by the slave devices 121 to 12n.

In operation S480, the master device 110 may generate a representative value based on segments having the same hash value. For example, the representative value may be obtained from the bias values of the segments having the same hash value. For example, the representative value may be or may correspond to or may be based on at least one of a mean value, a median, or a mode of the bias values of the segments.

In operation S490, the library may be updated. For example, a representative value of biased values of segments having the same hash value may be stored in the library, and a biased value of a segment having a hash value, e.g. a unique hash value, e.g. a value not matched with any other hash value, may be stored in the library.

To sum up example embodiments of FIGS. 12 and 13, a library is generated by calculating bias values (including a representative value) of segments with regard to the semiconductor chip "A". Here, consistency between patches of the semiconductor chip "A" is maintained by applying a representative value in common to segments having the same hash value. Alternatively or additionally, consistency between semiconductor chips is maintained by applying the representative value stored in the library in common to the semiconductor chips "B" to "Z". For example, segments having the same hash value may be resized in a similar manner and/or may have the same or similar serifs applied (e.g. added thereto and/or removed therefrom), by an amount corresponding to the representative value, and consistency may be improved.

Meanwhile, as each slave calculates bias values of all segments of the corresponding patch, a time taken to perform the optical proximity correction may excessively become long. Accordingly, another method for reducing a time taken to calculate a bias value may be adopted. This will be described with reference to FIGS. 14 and 15.

Figure 14:
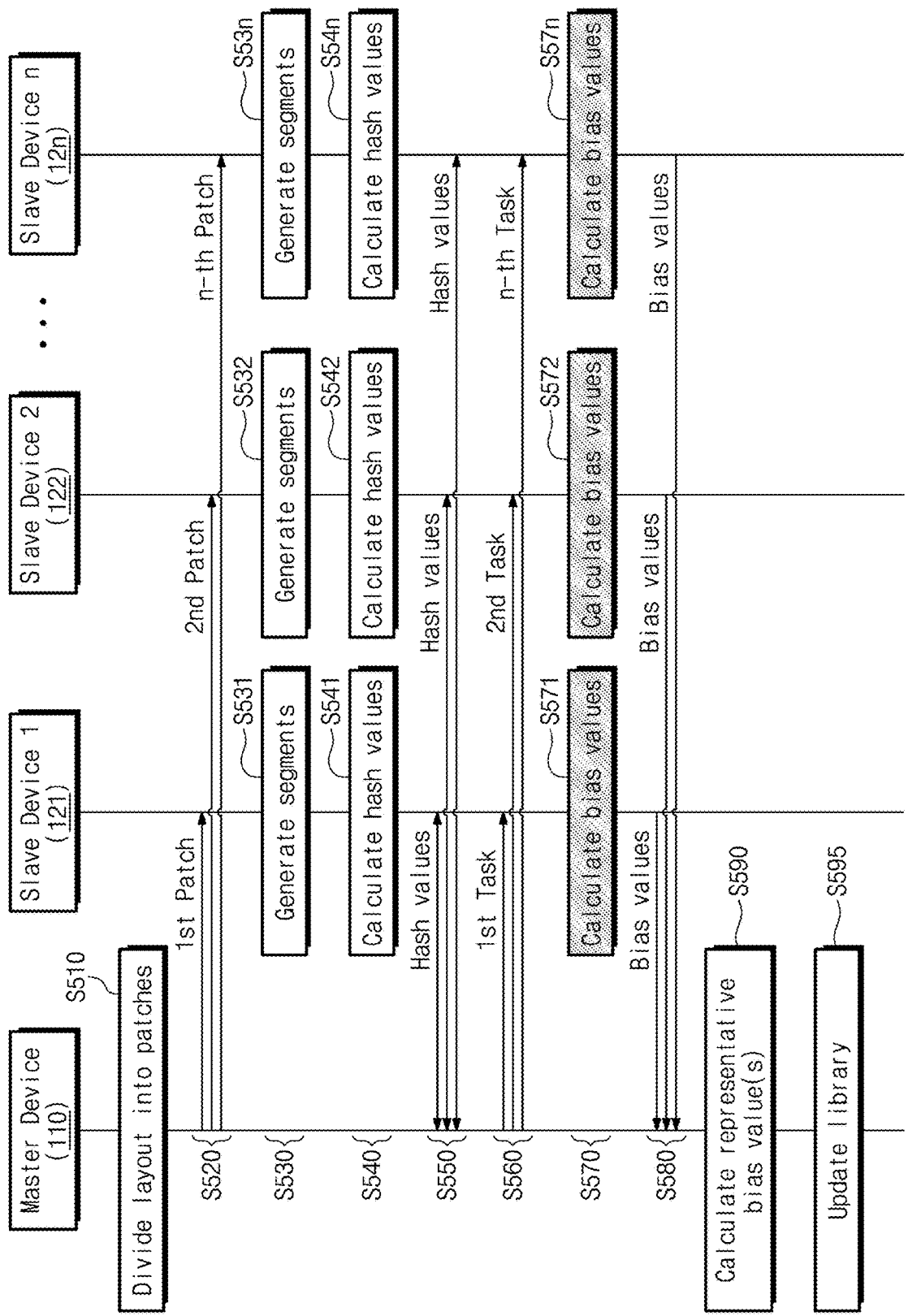
FIG. 14 illustrates a method for executing optical proximity correction according to some example embodiments of inventive concepts.
Figure 15:
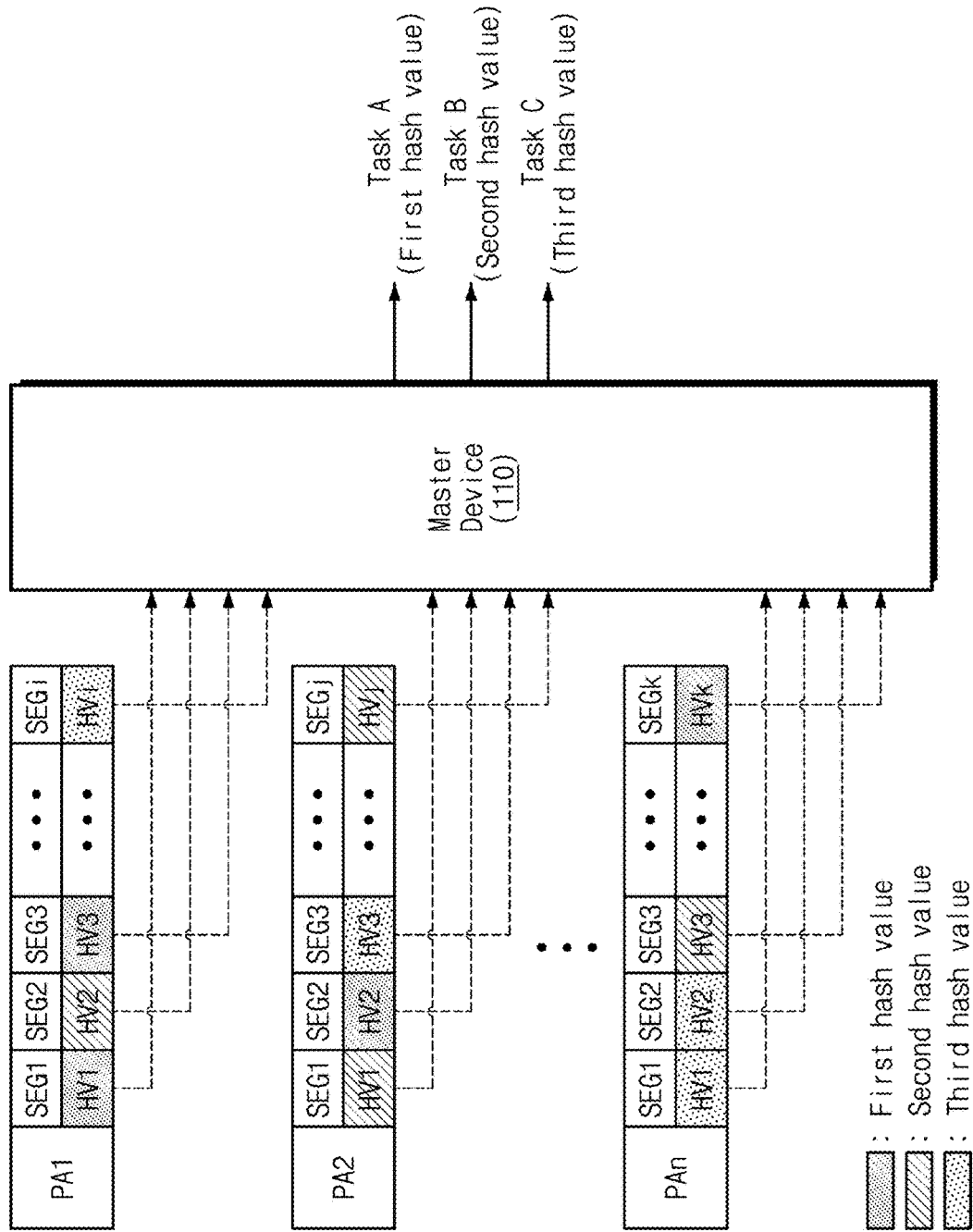
FIG. 15 conceptually illustrates tasks allocated by a master device.

FIG. 14 illustrates a method for executing optical proximity correction according to some example embodiments of inventive concepts. FIG. 15 conceptually illustrates tasks allocated by a master device.

Referring to FIG. 14, the master device 110 may divide the layout of the semiconductor chip "A" into the plurality of patches PA1 to PAn (S510) and may allocate the divided patches PA1 to PAn to each of the plurality of slave devices 121 to 12n, respectively (S520). Each slave device may generate segments from the corresponding patch (S531 to S53n) and may calculate hash values of the generated segments (S541 to S54n). The slave devices 121 to 12n may transmit the calculated hash values to the master device 110.

The master device 110 may allocate a task to each slave device based on the hash values (S560). Here, a task may mean to obtain bias values of segments having the same hash value (e.g., hash values matched with any other hash value). How the master device 110 allocates a task is described in detail with reference to FIG. 15 together.

In some example embodiments, the first slave device 121 generates segments SEG1 to SEGi from the first patch PA1 and calculates hash values HV1 to HVi respectively corresponding to the segments SEG1 to SEGi. The second slave device 122 generates a plurality of segments SEG1 to SEGj from the second patch PA2 and calculates hash values HV1 to HVj respectively corresponding to the segments SEG1 to SEGj. As in the above description, the n-th slave device 12n generates a plurality of segments SEG1 to SEGk from the n-th patch PAn and calculates hash values HV1 to HVk respectively corresponding to the segments SEG1 to SEGk.

Here, it is assumed that the hash values HV1 and HV3 of the first patch PA1, the hash value HV2 of the second patch PA2, and the hash value HVk of the n-th patch PAn are identical (hereinafter, referred to as a "first hash value"). It is further assumed that the hash value HV2 of the first patch PA1, the hash values HV1 and HVj of the second patch PA2, and the hash value HV3 of the n-th patch PAn are identical (hereinafter, referred to as a "second hash value"). It is further assumed that the hash value HVi of the first patch PA1, the hash value HV3 of the second patch PA2, and the hash values HV1 and HV2 of the n-th patch PAn are identical (hereinafter, referred to as a "third hash value").

According to example embodiments of FIG. 11, because each slave device calculates bias values of all segments, a time taken to perform the optical proximity correction may become long. However, according to example embodiments of FIG. 15, the master device 110 allocates a task to a slave device that takes charge of a patch, of which segments having the same hash value are the greatest in number. Here, a task may mean to calculate bias values of segments having the same hash value and to calculate a representative value based on the calculated bias values.

For example, because the patch, of which segments having the first hash value are the greatest in number, is the first patch PA1, the master device 110 may allocate a task "TASK A" such that the first slave device 121 taking charge in the first patch PA1 calculates bias values of the segments SEG1 and SEG3 of the first patch PAL The master device 110 may not allocate a task of calculating a bias value of the second segment SEG2 of the second patch PA2 to the second slave device 122. As in the above description, the master device 110 may not allocate a task of calculating a bias value of the k-th segment SEGk of the n-th patch PAn to the n-th slave device 12n.

As in the above description, because a patch, of which segments having the second hash value are the greatest in number, is the second patch PA2, the master device 110 may allocate a task "TASK B" such that the second slave device 122 calculates bias values of the segments SEG1 and SEGj of the second patch PA2. As in the above description, the master device 110 may process segments having the third hash value.

Returning to FIG. 14, in operation S570, the slave devices 121 to 12n may calculate bias values of segments. For example, the calculating of the bias values may include calculating a bias value associated with a task allocated by the master device 110. That is, the task allocated from the master device 110 may include calculating bias values of a plurality of segments having the same hash value. Alternatively or additionally, the calculating of the bias values may include calculating a bias value of a segment having a unique hash value (not matched with any other hash value), which is not associated with the task allocated from the master device 110. However, a slave device may not calculate a bias value associated with a task allocated to another slave device.

Referring to the example of FIG. 15, the first slave device 121 may calculate bias values of segments having the first hash value. However, the first slave device 121 may not calculate a bias value associated with the task (i.e., calculation of bias values of segments having the second hash value) allocated to the second slave device 122. The first slave device 121 may not calculate a bias value associated with the task (i.e., calculation of bias values of segments having the third hash value) allocated to the n-th slave device 12n. That is, the first slave device 121 does not calculate bias values of the segments SEG2 and SEGi. Of course, the first slave device 121 may calculate a bias value associated with a task not allocated to any other slave device.

As in the above description, the second slave device 122 may calculate hash values of the segments SEG1 and SEGj having the second hash value and may not calculate hash values of segments SEG2 and SEG3 allocated to any other slave devices. The n-th slave device 12n may calculate hash values of the segments SEG1 and SEG2 having the third hash value and may not calculate hash values of segments SEG3 and SEGk allocated to any other slave devices.

The master device 110 may collect the bias values calculated by the slave devices 121 to 12n (S580) and may calculate a representative value based on the collected bias values (S590).

For example, the master device 110 may calculate a representative value to be applied in common to segments having the first hash value, based on the bias values received from the first slave device 121. The master device 110 may calculate a representative value to be applied in common to segments having the second hash value, based on the bias values received from the second slave device 122. As in the above description, the master device 110 may calculate a representative value to be applied in common to segments having the third hash value, based on the bias values received from the n-th slave device 12n.

The master device 110 may update the calculated representative value(s) in the library. In addition, the master device 110 may update a bias value of a segment having a unique hash value (e.g. a hash value not matched with any other hash value) in the library. The representative value(s) and the bias value(s) of the updated library may be applied in common to any other semiconductor chip, as well as the patches PA1 to PAn. As a result, the consistency of the biased mask may be maintained.

Figure 16:
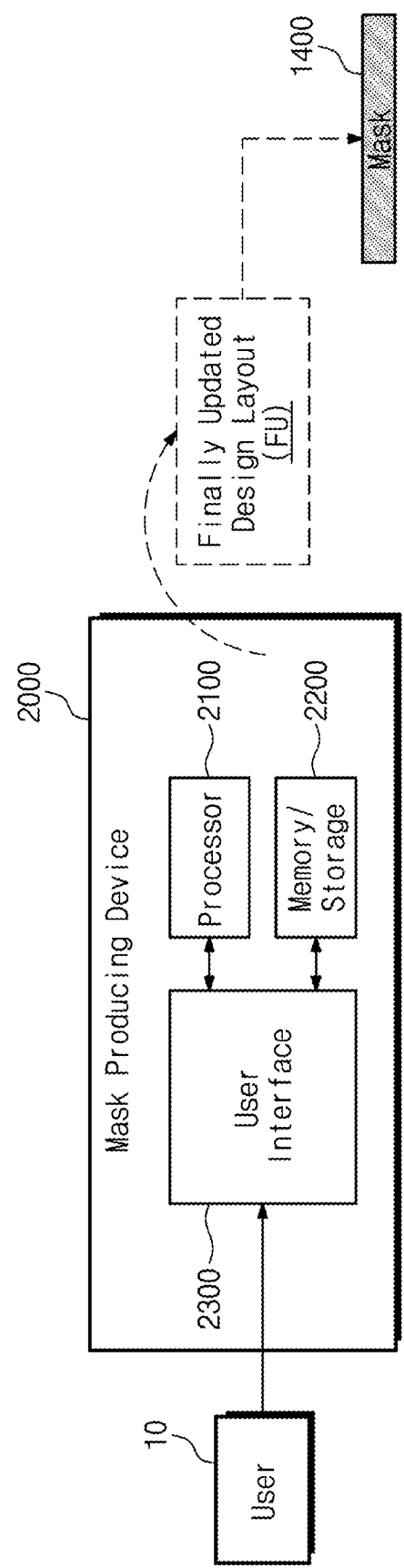
FIG. 16 is a block diagram illustrating a device for producing a mask generated by optical proximity correction of inventive concepts.

FIG. 16 is a block diagram illustrating a device for producing a mask generated by optical proximity correction of inventive concepts. Referring to FIG. 16, a mask producing device 2000 may include a processor 2100, a memory/storage 2200, and a user interface 2300. The mask producing device 2000 may be used to produce the mask 1400 according to embodiments of inventive concepts described with reference to FIGS. 2 to 15.

The processor 2100 may include at least one of a general-purposed processor and a dedicated processor such as a workstation processor. The processor 2100 may perform various arithmetic operations and/or logical operations for the purpose of performing operations described with reference to FIGS. 3 to 15, such as layout division, segment generation, hash value calculation, bias value calculation, representative value calculation, and update. To this end, the processor 2100 may include one or more processor cores. For example, the processor core of the processor 2100 may include a special purposed logic circuit such as field programmable gate array (FPGA) or application specific integrated chips (ASICs).

The memory/storage 2200 may temporarily or semipermanently store data processed or to be processed by the processor 2100. To this end, the memory/storage 2200 may include at least one of a volatile memory such as dynamic random access memory (DRAM), static RAM (SRAM), synchronous DRAM (SDRAM), or the like, and/or a nonvolatile memory such as a flash memory, phase-change RAM (PRAM), magneto-resistive RAM (MRAM), resistive RAM (ReRAM), ferro-electric RAM (FRAM), or the like.

The embodiments of inventive concepts described with reference to FIGS. 3 to 15 may be implemented depending on operations of the processor 2100 and the memory/storage 2200. The mask producing device 2000 may be used to produce the mask 1400 depending on the operations of the processor 2100 and the memory/storage 2200.

The mask producing device 2000 may perform software depending on the operation of the processor 2100 and the memory/storage 2200. For example, the software may include an operating system (OS) and/or one or more applications. The operating system may provide one or more services to an application program, and may operate as an intermediator between components of the mask producing device 2000. For example, the application program may include a program that is used to design a layout depending on example embodiments of inventive concepts described with reference to FIGS. 3 to 15.

The user interface 2300 may provide a result obtained by the operations of the processor 2100 and the memory/storage 2200 to a user 10, such as a physical design engineer (PHY engineer). In addition, the user interface 2300 may be used to receive various data (e.g., data associated with designing layout) from the user 10. For example, the user 10 may be a designer of the mask 1400 and a layout. For example, the user interface 2300 may include an input/output interface such as a display device, a speaker, a keyboard, or a mouse.

The mask producing device 2000 may output a finally updated design layout FU depending on the embodiments of inventive concepts described with reference to FIGS. 3 to 15. The mask producing device 2000 may produce the mask 1400 based on the finally updated design layout FU. The mask 1400 may be produced to include image patterns corresponding to the finally updated design layout FU. The mask producing device 2000 may be or may include an electron-beam (e-beam) writer that forms patterns a photomask, such as a blank photomask. For example, the mask producing device 2000 may etch chrome-on-glass to form the pattern on the photomask.

Although example embodiments according to FIGS. 8 and 9 may improve OPC and consistency for inter-chip OPC design across multiple chips, example embodiments are not limited thereto. For example, according to some example embodiments, an OPC process for semiconductor chips having similar designs, such as semiconductor chip "A" to semiconductor chip "Z", may be improved, and/or consistency may be improved. In addition to semiconductor chips having similar designs, individual layers within a particular semiconductor chip may have similar elements/features, and OPC may be improved according to some example embodiments. For example, semiconductor chip "A" may have two, three, four, or more metal layers that are stacked on each other. Some of the metal layers, such as the first metal layer and the second metal layer, may have segments with similar lengths and/or distances, as described with reference to FIGS. 9 and 10. Accordingly, in addition to example embodiments enabling inter-chip OPC to be performed more consistently, example embodiments may enable intra-chip OPC to be performed more consistently.

According to some example embodiments, with regard to each of segments generated from a layout, a hash value is calculated in consideration of a characteristic of a segment itself and a surrounding segment. Also, there is calculated a representative value of bias values of segments having the same hash value. The calculated representative value is applied in common to the segments having the same hash value. Therefore, the consistency between patches or semiconductor chips is maintained, and/or an efficiency of an OPC process is improved.

While inventive concepts have been described with reference to example embodiments thereof, it will be apparent to those of ordinary skill in the art that various changes and modifications may be made thereto without departing from the spirit and scope of inventive concepts as set forth in the following claims.

What is claimed is:

1. A non-transitory computer-readable medium comprising a program code that, when executed by at least one processing circuitry, causes the at least one processing circuitry to:
   divide a layout of a semiconductor chip into a plurality of patches;
   generate a plurality of segments from the divided layout of each of the plurality of patches, wherein a first patch of the plurality of patches includes first segments and a second patch of the plurality of patches includes second segments;
   calculate hash values corresponding to the first segments and hash values corresponding to the second segments, the calculating the hash values being by using a hash function;
   calculate bias values of a subset of first segments having a first hash value;
   calculate a representative value based on the bias values; and
   apply the representative value to the subset of segments having the first hash value from among the hash values of the first segments,
   wherein the hash function depends on at least one of a first characteristic value of each segment of the plurality of segments, a second characteristic value of at least one segment adjacent to the each segment, or a third characteristic value between the each segment and the at least one segment.

2. The computer-readable medium of claim 1, wherein the representative value is based on at least one of a mean value, a median value, or a mode value, the mean value, the median value, and the mode value being based on the bias values of the segments having the first hash value.

3. The computer-readable medium of claim 1, wherein the program code, when executed by the at least one processing circuitry, further causes the at least one processing circuitry to:
   update the representative value in a library.

4. The computer-readable medium of claim 1, wherein the program code, when executed by the at least one processing circuitry, further causes the at least one processing circuitry to:

calculate a bias value of another segment having another hash value from among the hash values of the first segments, the another hash value not being matched with any other hash value from among the hash values of the first segments.

5. The computer-readable medium of claim 4, wherein the program code, when executed by the at least one processing circuitry, further causes the at least one processing circuitry to:
update the bias value of the another segment in a library.

6. The computer-readable medium of claim 1, wherein the program code, when executed by the at least one processing circuitry, further causes the at least one processing circuitry to:
apply the representative value to segments having the first hash value from among the second segments.

7. The computer-readable medium of claim 1, wherein at least one of,
(a) the first characteristic value includes at least one of a length or a biasing direction of the each segment,
(b) the second characteristic value includes a length of the at least one segment, or
(c) the third characteristic value includes a distance between the each segment and the at least one segment.

8. The computer-readable medium of claim 7, wherein, in response to the length of the each segment extending in a first direction and a second direction,
the hash function is independently based on each of a component of a first length of the each segment in the first direction and a component of a second length of the each segment in the second direction.

9. The computer-readable medium of claim 7, wherein, in response to the length of the at least one segment extending in a first direction and a second direction,
the hash function is independently based on each of a component of the at least one segment in the first direction and a component of the at least one segment in the second direction.

10. The computer-readable medium of claim 7, wherein, when calculating a bias value of the each segment, the biasing direction indicates an order to be simulated in units of a grid.

11. A computer-readable medium comprising a non-transitory program code that, when executed by at least one processing circuitry, causes the at least one processing circuitry to:
generate a plurality of segments from a layout of a semiconductor device;
calculate a hash value of each segment of the plurality of segments by using a hash function which depends on at least one of a first characteristic value of the each segment, a second characteristic value of at least one segment adjacent to the each segment, or a third characteristic value between the each segment and the at least one segment;
calculate bias values with respect to the plurality of segments, respectively;
calculate a representative value based on bias values of a subset of the plurality of segments, the subset of the plurality of segments having the same hash value from among the calculated hash values; and
apply the representative value to the plurality of segments having the same hash value.

12. The computer-readable medium of claim 11, wherein the first characteristic value includes at least one of a length or a biasing direction of the each segment,
the second characteristic value includes a length of the at least one segment, and
the third characteristic value includes a distance between the each segment and the at least one segment.

13. The computer-readable medium of claim 12, wherein, in response to the length of the each segment extending in a first direction and a second direction,
the hash function is independently based on each of a component of a first length of the each segment in the first direction and a component of a second length of the each segment in the second direction.

14. The computer-readable medium of claim 12, wherein, in response to the length of the at least one segment extends in a first direction and a second direction,
the hash function is independently based on each of a component of the at least one segment in the first direction and a component of the at least one segment in the second direction.

15. The computer-readable medium of claim 12, wherein, when calculating a bias value of the each segment, the biasing direction indicates an order to be simulated in units of a grid.

16. The computer-readable medium of claim 11, wherein the calculating of the representative value includes:
calculating an average value of the bias values of the plurality of segments having the same hash value.

17. A method for manufacturing a semiconductor device, the method comprising:
generating a plurality of segments from a layout of the semiconductor device;
calculating a hash value of each segment of the plurality of segments by using a hash function which depends on at least one of a first characteristic value of the each segment, a second characteristic value of at least one segment adjacent to the each segment, or a third characteristic value between the each segment and the at least one segment;
calculating bias values with respect to the plurality of segments, respectively;
calculating a representative value based on bias values of a plurality of segments having the same hash value from among the calculated hash values;
generating a biased mask depending on the representative value; and
forming patterns on a substrate by using the biased mask.

18. The method of claim 17, wherein the first characteristic value includes at least one of a length or a biasing direction of the each segment,
wherein the second characteristic value includes a length of the at least one segment, and
wherein the third characteristic value includes a distance between the each segment and the at least one segment.

19. The method of claim 18, wherein, when the length of the each segment extends in a first direction and a second direction, each of a component of a first length of the each segment in the first direction and a component of a second length of the each segment in the second direction independently affects the hash function.

20. The method of claim 17, wherein the calculating of the representative value includes:
calculating an average value of the bias values of the plurality of segments having the same hash value.

* * * * *